(12) United States Patent
Mishima et al.

(10) Patent No.: US 6,930,016 B2
(45) Date of Patent: Aug. 16, 2005

(54) POSITION DETECTION APPARATUS AND METHOD, EXPOSURE APPARATUS, AND DEVICE MANUFACTURING METHOD

(75) Inventors: Kazuhiko Mishima, Tochigi (JP); Hiroshi Tanaka, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/242,617

(22) Filed: Sep. 13, 2002

(65) Prior Publication Data

US 2003/0053059 A1 Mar. 20, 2003

(30) Foreign Application Priority Data

Sep. 17, 2001 (JP) ........................................ 2001-282102

(51) Int. Cl.[7] ............................................. G03B 27/42
(52) U.S. Cl. ..................... 438/401; 355/53; 250/498.1; 250/498.24
(58) Field of Search ...................... 438/401; 355/52–57, 355/67–68; 250/498.1, 498.24, 201.1, 559.3

(56) References Cited

U.S. PATENT DOCUMENTS

| | | | |
|---|---|---|---|
| 5,774,575 A | 6/1998 | Tanaka et al. | 382/149 |
| 5,815,594 A | 9/1998 | Tanaka | 382/151 |
| 5,841,520 A * | 11/1998 | Taniguchi | 355/53 |
| 5,943,135 A | 8/1999 | Mishima | 356/401 |
| 6,151,121 A | 11/2000 | Mishima | 356/399 |
| 6,295,120 B1 * | 9/2001 | Miyatake | 355/53 |

* cited by examiner

*Primary Examiner*—H. Jey Tsai
(74) *Attorney, Agent, or Firm*—Fitzpatrick, Cella, Harper & Scinto

(57) ABSTRACT

In a position detection apparatus which detects the position of an alignment mark, the alignment mark is sensed by a low-magnification image sensing system to acquire a rough position, and a stage is aligned based on the acquired rough position. The alignment mark is sensed by a high-magnification image sensing system to acquire an accurate position. The photoelectric conversion elements of the high- and low-magnification image sensing optical systems are elements whose storage times can be set. A controller determines the signal intensity levels of the photoelectric conversion elements on the basis of electrical signals from the photoelectric conversion elements of the high- and low-magnification image sensing optical systems, and sets storage times appropriate for the photoelectric conversion elements. The position of the alignment mark is detected using signals from the photoelectric conversion elements whose storage times are properly set.

10 Claims, 22 Drawing Sheets

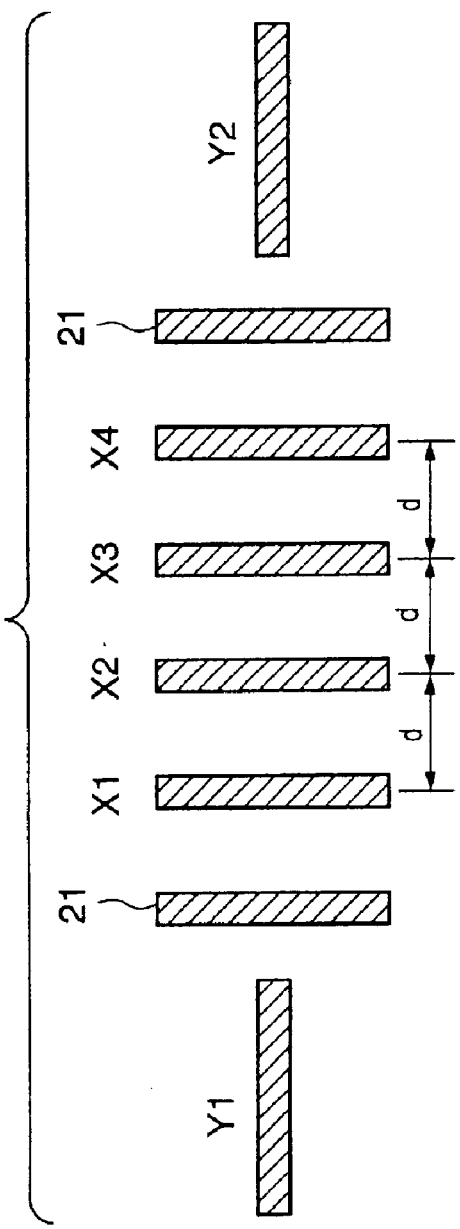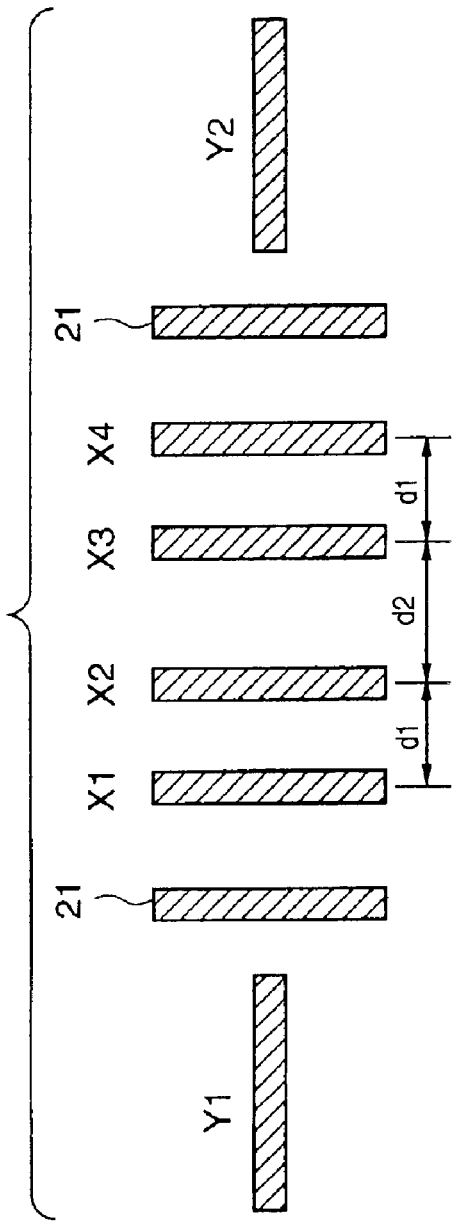

US 6,930,016 B2

POSITION DETECTION APPARATUS AND METHOD, EXPOSURE APPARATUS, AND DEVICE MANUFACTURING METHOD

FIELD OF THE INVENTION

The present invention relates to an alignment apparatus and method for aligning a wafer or the like, a semiconductor exposure apparatus using them, and a device manufacturing method.

BACKGROUND OF THE INVENTION

FIG. 18 is a block diagram for explaining the arrangement of a general alignment mechanism. FIG. 19 is a view showing a wafer on which an alignment mark is formed. FIG. 20 is a flow chart for explaining general alignment processing procedures. Wafer alignment by a general semiconductor manufacturing apparatus will be described with reference to these drawings.

If a wafer W is supplied to the semiconductor manufacturing apparatus, a mechanical alignment apparatus MA mechanically aligns the wafer W by using the periphery of the wafer W and an orientation flat or notch (notch N is shown in FIG. 19) to determine the rough position of the wafer W (step S02). The mechanical alignment precision is about 20 $\mu$m. Then, the wafer is set on a chuck CH by a wafer supply apparatus (not shown) (step S03), and pre-aligned (step S04). In pre-alignment, a mirror MM is inserted into an optical path formed by an alignment light source Li and mirror M1 in a scope SC. The mirror MM guides alignment light to a sensor S1 set to a low magnification. In pre-alignment, left and right pre-alignment marks PAL and PAR shown in FIG. 19 are detected using the low-magnification sensor S1, and their mark positions are obtained to attain the center of the wafer. The alignment precision in this pre-alignment is about 4 $\mu$m.

Finally, global alignment is performed to accurately obtain the position of the wafer W and the position of an exposure shot (step S05). In global alignment, the mirror MM is removed from the optical path in the scope SC. A sensor S2 set to a high magnification is used to measure the positions of global alignment marks FX1 to FX4 and FY1 to FY4 on the wafer W shown in FIG. 19. Global alignment provides X- and Y-direction shifts of the wafer W, the rotational component, and the magnification component of the shot array. The global alignment precision must be 50 nm or less in a machine which manufactures current 256-Mbit memories.

The scope SC shown in FIG. 18 will be explained with reference to FIG. 21. FIG. 21 is a view showing the schematic arrangement of the scope SC.

In FIG. 21, light guided from an illumination light source 401 (fiber or the like) passes through a switching ND filter 415 serving as a beam attenuation means. Then, light is guided to a polarization beam splitter 403 (corresponding to the mirror M1 in FIG. 18) via an illumination optical system 402.

The switching ND filter 415 is made up of ND filters (415a to 415f) having a plurality of discrete transmittances. A desired ND filter can be used by driving a rotation driving system 420. A controller 421 controls the rotation driving system 420 to select an ND filter so as to optimize the brightness in accordance with the reflectance of an object to be observed.

The filter is not limited to the switching ND filter. The same structure can also be constituted by rotation of a polarizing plate for a light source such as an He—Ne laser which emits light having a uniform polarization characteristic.

S-polarized light reflected by the polarization beam splitter 403 to a direction perpendicular to the sheet surface of FIG. 21 passes through a relay lens 404 and $\lambda/4$ plate (¼-wavelength plate) 409. After that, light is circularly polarized and Kohler-illuminates an alignment mark AM formed on a wafer 6 via an objective lens 405.

Reflected light, diffracted light, and scattered light from the alignment mark AM return through the objective lens 405 and $\lambda/4$ plate 409, and are converted into P-polarized light parallel to the sheet surface of FIG. 21. P-polarized light passes through the polarization beam splitter 403, and forms the image of the alignment mark AM on a photoelectric conversion element 411 (413) (e.g., CCD camera) via an imaging optical system 410 (412). The position of the wafer 6 is detected based on the position of the photoelectrically converted alignment mark image.

The imaging optical systems 410 and 412 will be described. The switching mirror 414 (corresponding to the mirror MM in FIG. 18) which switches an optical path is interposed between the polarization beam splitter 403 and the imaging optical system 410 (412). The switching mirror 414 is inserted into an optical path to guide light to the imaging optical system 412 having a low magnification, which allows observing the alignment mark AM on the wafer at low magnification in a wide region. The switching mirror 414 is removed from the optical path to guide light to the high-magnification detectable imaging optical system 410. The high-magnification imaging optical system 410 makes it possible to detect the alignment mark on the wafer at high precision in a narrow region.

The controller 421 acquires a wafer position on the basis of information about the photoelectrically converted alignment mark image. The controller 421 sets an optimum one of the ND filters 415a to 415f by issuing a command to the rotation driving system 420 so as to optimize the light quantity in accordance with the brightness and contrast of the alignment mark AM.

At this time, to detect the alignment mark AM on the wafer 6 at high precision, the image of the alignment mark AM must be clearly detected. In other words, the SC must be focused on the alignment mark AM. For this purpose, an AF detection system (not shown) is generally constituted. The alignment mark is driven to the best focus plane of the SC on the basis of the detection result of the AF detection system, thus detecting the alignment mark.

As described above, accurately obtaining the wafer position requires at least pre-alignment and global alignment on the chuck. In pre-alignment, the mark must be detected in a wide field of view after rough alignment by mechanical alignment. The mark must be detected by a low-magnification scope and must be as large as about 100 $\mu$m. In global alignment, the mark is precisely detected by a high-magnification scope because the mark has already been aligned with a shift of about 4 $\mu$m by pre-alignment.

While a plurality of detection systems for low magnification (pre-alignment) and high magnification (global alignment) are required, demands are arising for short-time detection and measurement. Since the number of wafers processed per unit time must be increased, the time of processing called alignment not accompanied by exposure must be shortened as much as possible.

A general scope SC used for alignment must drive the switching ND filter 415 for an optimum light quantity, and adjust the light quantity to an optimum one (light control) every high/low-magnification detection. The frequency at which the switching ND filter 415 is switched increases, further decreasing the throughput of exposure processing.

SUMMARY OF THE INVENTION

The present invention has been made to overcome the conventional drawbacks, and has as its object to enable setting proper light quantities for respective position detection systems, thereby increasing the mark detection precision.

It is another object of the present invention to achieve a short mark detection time and high alignment processing speed in addition to high mark detection precision.

According to the present invention, the foregoing object is attained by providing a position detection apparatus which detects a position of an alignment mark, comprising; a plurality of detection systems which have photoelectric conversion elements and sense the alignment mark; adjustment means for individually adjusting signal levels output from the plurality of photoelectric conversion elements; and calculation means for calculating the position of the alignment mark on the basis of electrical signals from the photoelectric conversion elements adjusted by the adjustment means.

According to another aspect of the present invention the foregoing object is attained by providing a position detection apparatus which detects positions of a plurality of alignment marks formed on a substrate, comprising; a stage which can move with holding the substrate; a first detection system which has a first photoelectric conversion element and senses the alignment mark at a first magnification; a second detection system which has a second photoelectric conversion element and senses the alignment mark at a second magnification higher than the first magnification; adjustment means for individually adjusting signal information intensities output from the first and second photoelectric conversion elements; first acquisition means for moving the stage, causing the first detection system to sense an alignment mark, and acquiring a rough position of the alignment mark; and second acquisition means for moving the alignment mark to a field of view of the second detection system on the basis of the rough position, causing the second detection system to sense the alignment mark, and acquiring the position of the alignment mark.

In still another aspect of the present invention, the foregoing object is attained by providing a position detection method of detecting a position of an alignment mark by using a plurality of detection systems which have photoelectric conversion elements and sense the alignment mark, comprising; the adjustment step of individually adjusting signal levels output from the plurality of photoelectric conversion elements; and the calculation step of calculating the position of the alignment mark on the basis of electrical signals from the plurality of photoelectric conversion elements adjusted in the adjustment step.

In still another aspect of the present invention, the foregoing object is attained by providing a position detection method which uses a stage which can move with holding a substrate, a first detection system which has a first photoelectric conversion element and senses the alignment mark at a first magnification, and a second detection system which has a second photoelectric conversion element and senses the alignment mark at a second magnification higher than the first magnification, and detects positions of a plurality of alignment marks formed on the substrate, comprising; the adjustment step of individually adjusting signal information intensities output from the first and second photoelectric conversion elements; the first acquisition step of moving the stage, causing the first detection system to sense an alignment mark, and acquiring a rough position of the alignment mark; and the second acquisition step of moving the alignment mark to a field of view of the second detection system on the basis of the rough position, causing the second detection system to sense the alignment mark, and acquiring the position of the alignment mark.

According to the present invention, there are also provided an exposure apparatus using the position detection apparatus, and a device manufacturing method.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIGS. 3A and 3B are views for explaining still other examples of the alignment mark usable in the embodiment;

DETAILED DESCRIPTION OF THE PREFERRED EMBODIMENTS

Preferred embodiments of the present invention will now be described in detail in accordance with the accompanying drawings.

<First Embodiment>

An alignment mark used in the first embodiment will be explained. This embodiment adopts alignment marks as shown in FIGS. 1 to 3B as an alignment mark which can be shared between global alignment and pre-alignment.

Figure 1:
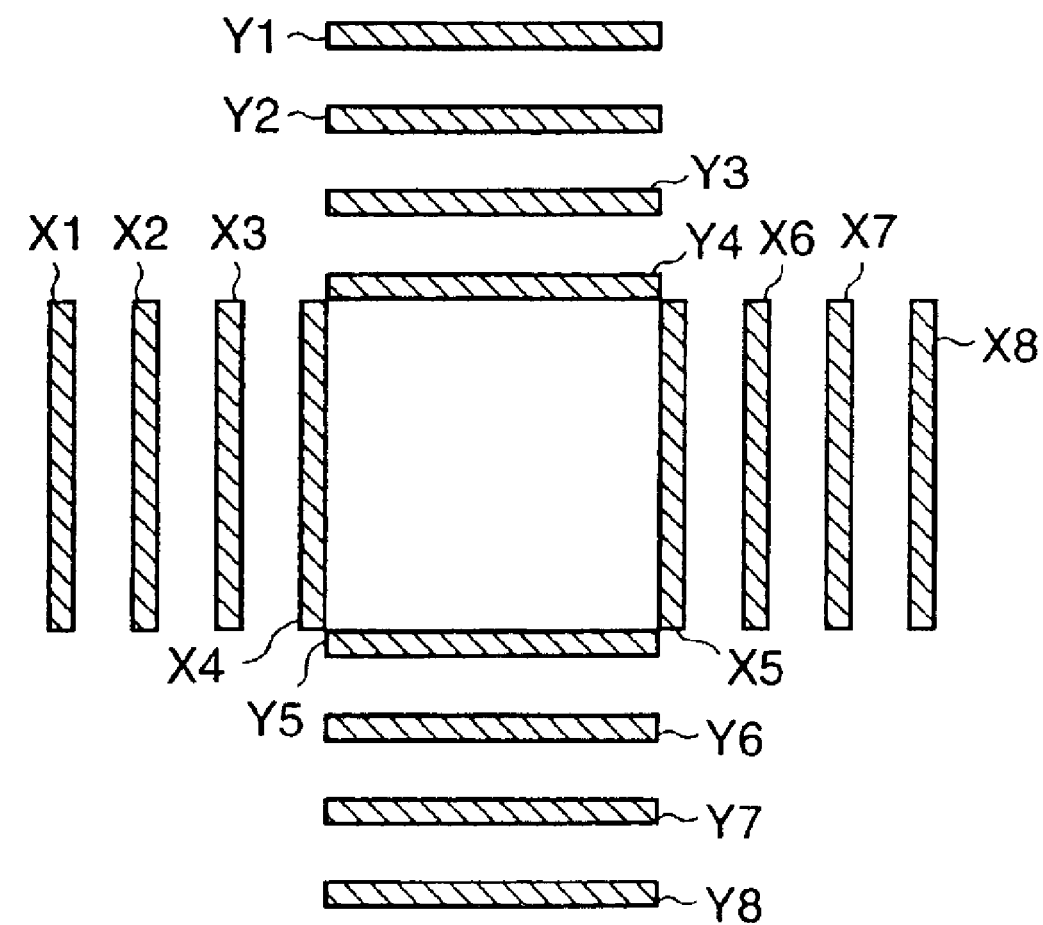
FIG. 1 is a view for explaining an example of an alignment mark usable in an embodiment.

FIG. 1 is a view for explaining an example of the alignment mark usable in the first embodiment. The alignment mark shown in FIG. 1 is made up of eight X-direction measurement marks (X1 to X8) and eight Y-direction measurement marks (Y1 to Y8). This alignment mark can provide the X and Y positions of the mark in pre-alignment and global alignment. In pre-alignment, the two-dimensional arrangement of the 16 measurement marks is recognized by a low-magnification detection system by pattern matching, and X- and Y-direction positions are simultaneously calculated from the mark. In global alignment, the mark position is detected by a high-magnification detection system at higher resolving power than in pre-alignment.

Figure 2A:
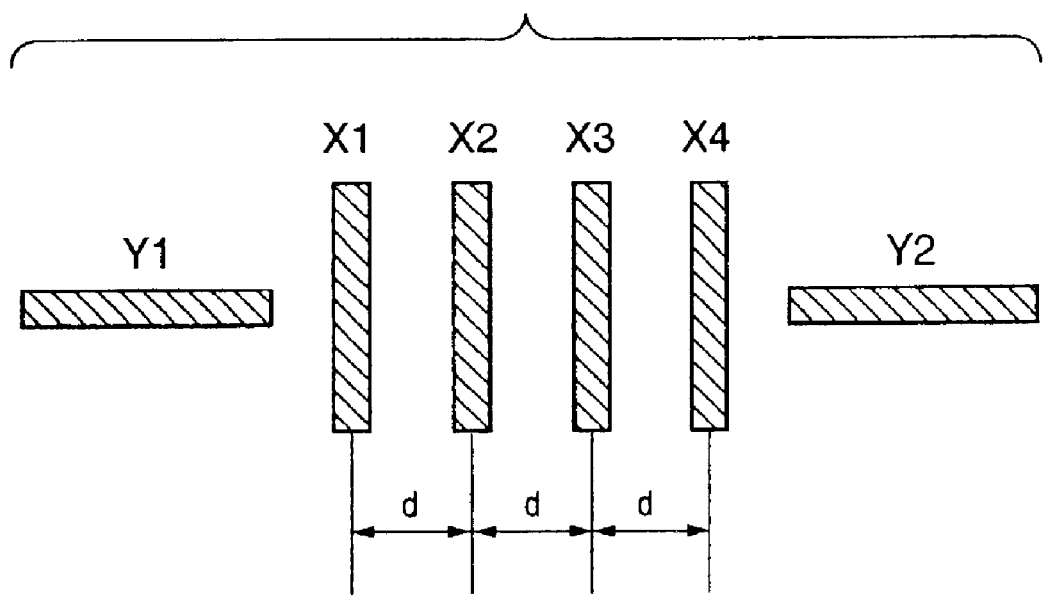
FIGS. 2A and 2B are views for explaining other examples of the alignment mark usable in the embodiment.
Figure 2B:
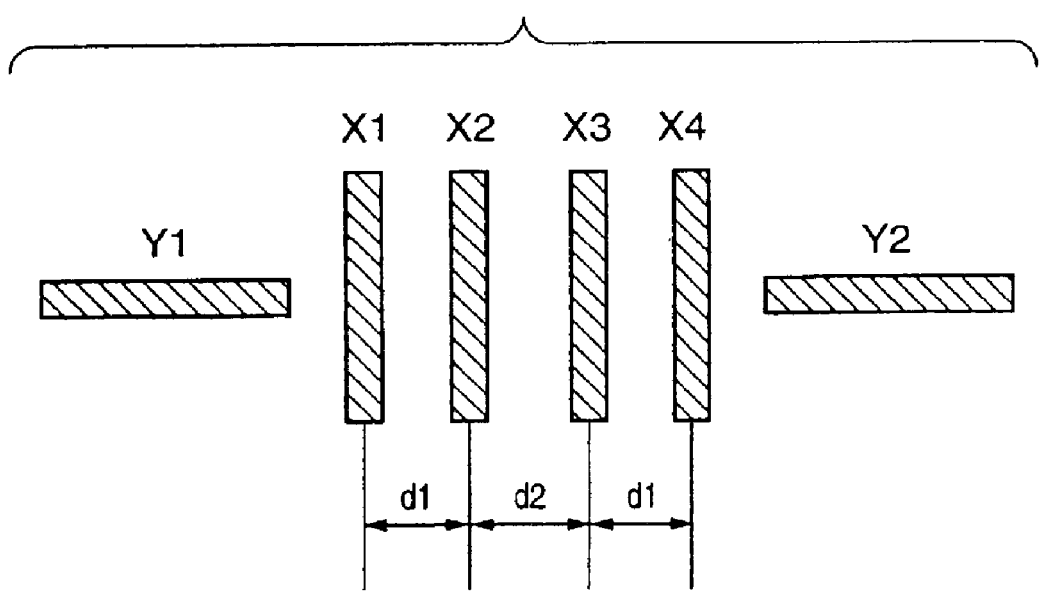

FIGS. 2A and 2B are views for explaining other examples of the alignment mark usable in the first embodiment. The alignment mark shown in FIG. 2A can be shared between global alignment and pre-alignment and arranged on a narrow scribe line. In pre-alignment, the two-dimensional arrangement of a total of six measurement marks, i.e., X-direction measurement marks X1, X2, X3, and X4 and Y-direction measurement marks Y1 and Y2 is recognized by a low-magnification detection system by pattern matching, and X- and Y-direction positions are simultaneously calculated from the mark.

In global alignment, X-direction measurement is done using the X measurement marks X1 to X4. In global alignment, X1 to X4 are observed by a high-magnification scope (high-magnification detection system), and the mark position is detected at higher resolving power than in pre-alignment.

In the mark shown in FIG. 2B, the interval between X measurement marks is changed (d1 and d2). Changing the mark interval can decrease detection errors in pattern matching processing in pre-alignment or the like. For example, when wiring patterns with the interval d1 exist in a wafer, they may be erroneously detected as an alignment mark. To the contrary, wiring patterns with the intervals d1 and d2 hardly exist adjacent to each other.

FIGS. 3A and 3B are views for explaining still other examples of the alignment mark usable in the first embodiment. The alignment mark shown in FIG. 3A is so designed as to reduce the influence of a resist applied onto an alignment mark on detection. Two fence marks 21 are arranged outside four center measurement marks (X1 to X4). These fence marks reduce the influence of resist coating nonuniformity. In FIG. 3B, the fence marks 21 which reduce the influence of resist coating are arranged. In addition, the interval between the four center measurement marks (X1 to X4) is changed to decrease the erroneous detection frequency in pre-alignment, similar to the alignment mark of FIG. 2B.

Also in global alignment, the erroneous detection frequency becomes low with a different measurement mark interval even at one portion in detecting a mark position, as shown in FIGS. 2B and 3B. When four mark positions on the mark shown in FIG. 2B or 3B are accurately obtained, the interval between marks may be erroneously detected as a mark. This occurs when a pseudo mark appears between marks due to generation of interference fringes. By changing even one interval between measurement marks, the mark interval is compared with the mark design value after detection of four mark positions, and whether the mark is erroneously detected can be checked. A retry function of, if erroneous detection is determined, changing the target processing position to a position shifted by half the pitch and calculating the position again can be added.

Figure 12:
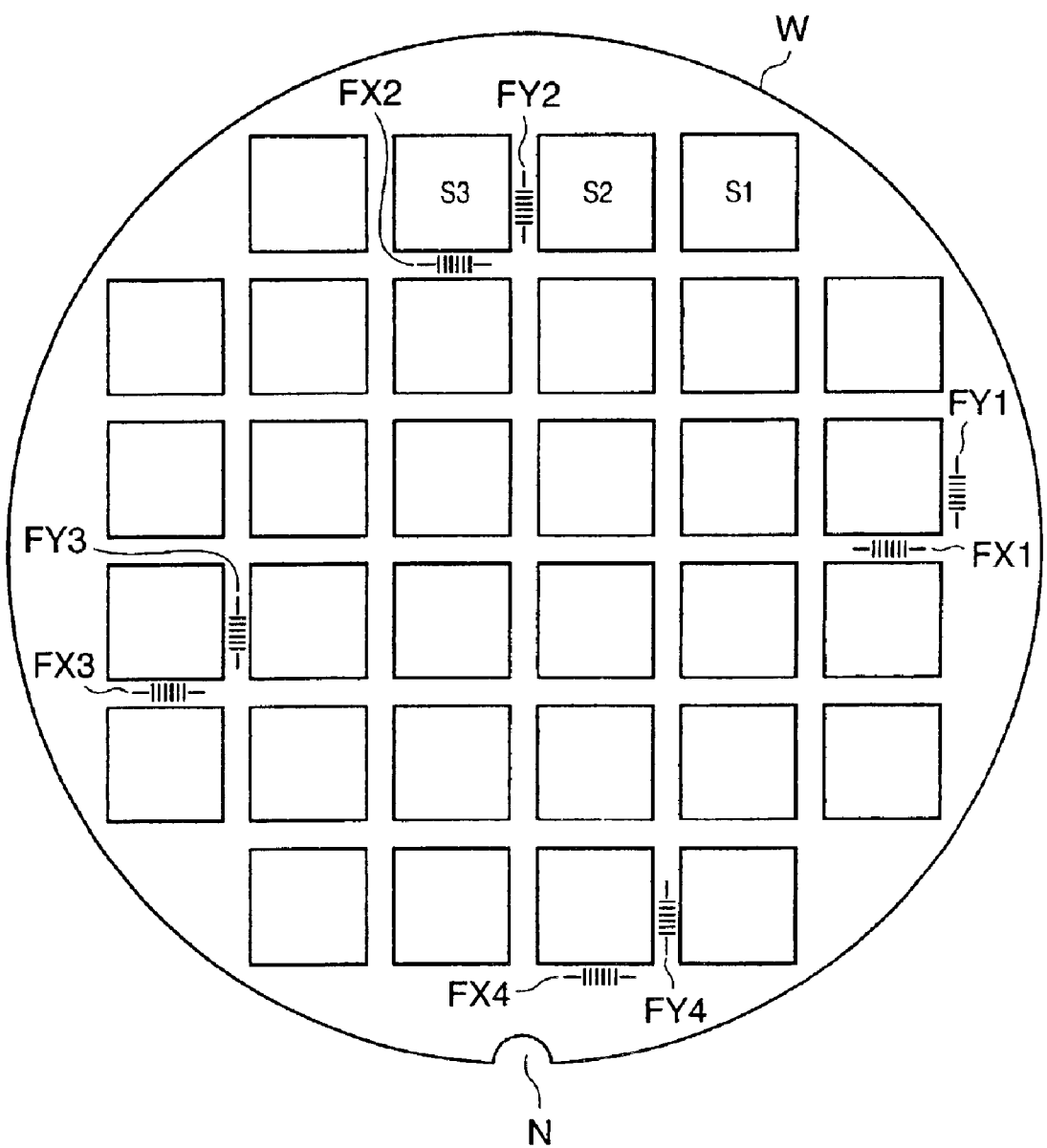
FIG. 12 is a view showing a wafer substrate on which the alignment mark shown in FIG. 3A is formed.

Y measurement in global alignment uses a mark prepared by rotating each of the marks in FIGS. 2A, 2B, 3A, and 3 through 90° (see FIG. 12).

An alignment mechanism and operation in the first embodiment using the above-described alignment mark will be described. Alignment operation using the alignment mark shown in FIG. 1 will be explained.

Figure 4:
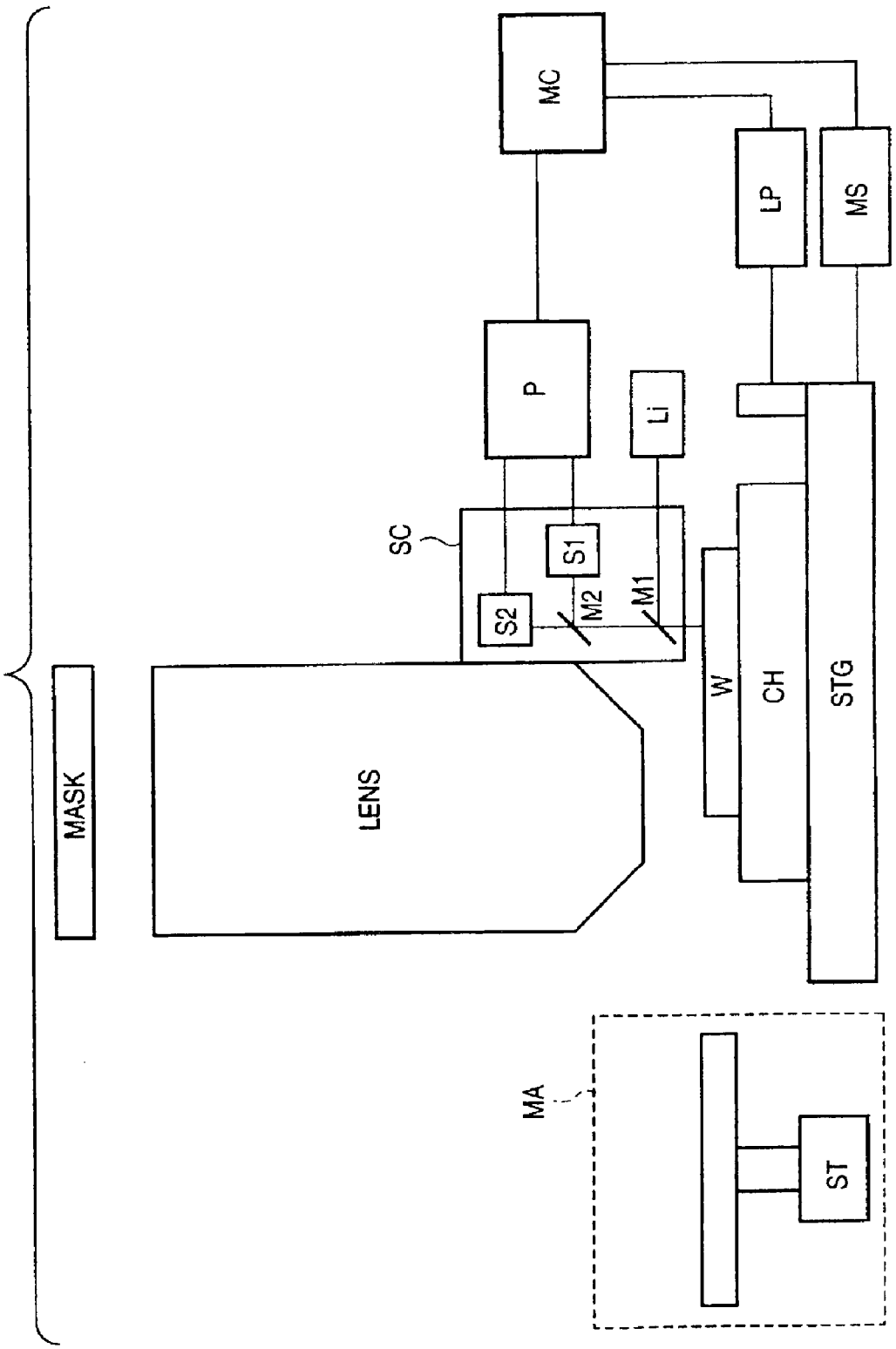
FIG. 4 is a block diagram for explaining the arrangement of an exposure apparatus having an alignment mechanism according to the embodiment.
Figure 5:
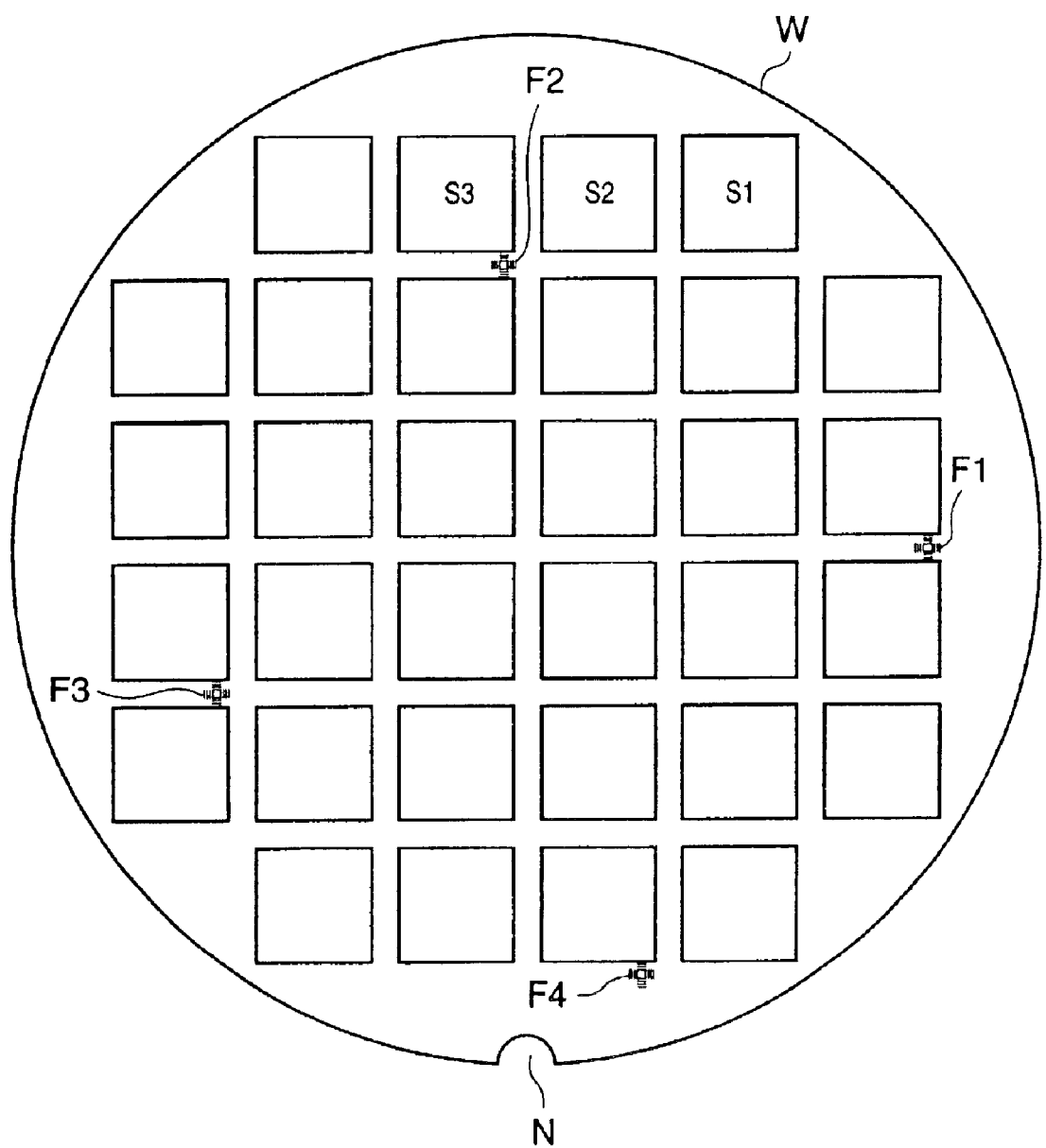
FIG. 5 is a view showing a wafer on which alignment marks (F1 to F4) in FIG. 1 are formed.

FIG. 4 is a block diagram for explaining the arrangement of an exposure apparatus having the alignment mechanism of the first embodiment. FIG. 5 is a view showing a wafer on which alignment marks (F1 to F4) in FIG. 1 are formed. The schematic operation of the alignment mechanism according to the first embodiment will be described with reference to the flow chart of FIG. 20. If a wafer W is supplied to a semiconductor manufacturing apparatus, a mechanical alignment apparatus MA mechanically aligns the wafer W by using the periphery of the wafer and an orientation flat or notch (notch N is shown in FIG. 5) to determine the rough position of the wafer W (step S02). Then, the wafer is set on a chuck CH by a wafer supply apparatus (not shown) (step S03), and pre-aligned by a low-magnification detection system (step S04). Pre-alignment uses F1 and F3, or F2 and F4 shown in FIG. 5. Each mark is sensed using the low-magnification detection system of a scope SC. The mark position is obtained by pattern matching to detect the center of the wafer. The pre-alignment precision is higher as the interval between two marks to be measured is larger.

Global alignment is performed to accurately obtain the wafer position and exposure shot position (step S05). In global alignment, a plurality of global alignment marks F1 to F4 on the wafer are measured using a detection system having a higher magnification than in pre-alignment. X- and Y-direction shifts of the wafer W, the rotational component, and the magnification component of the shot array are obtained.

Figure 20:
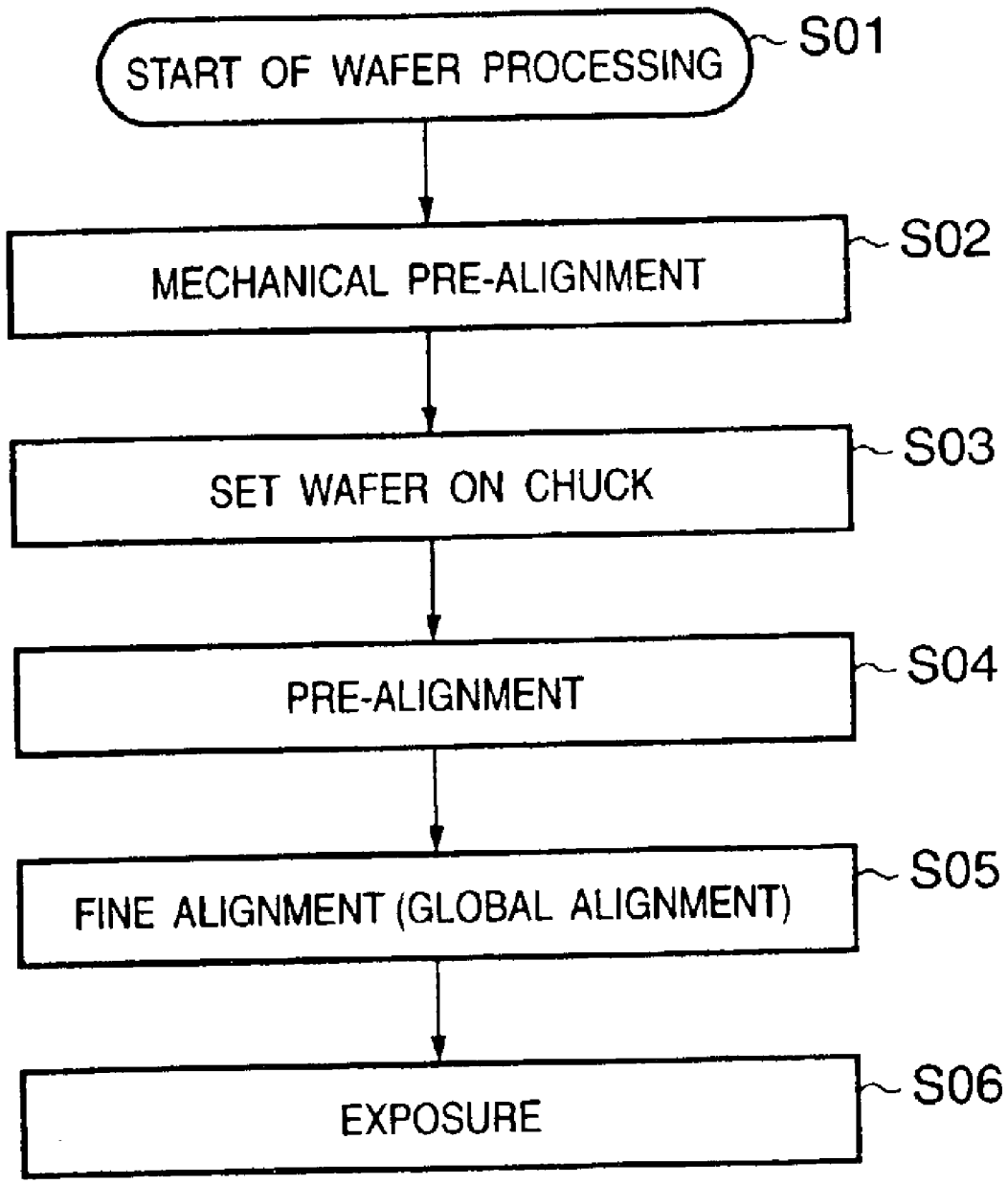
FIG. 20 is a flow chart for explaining general alignment processing procedures.
Figure 21:
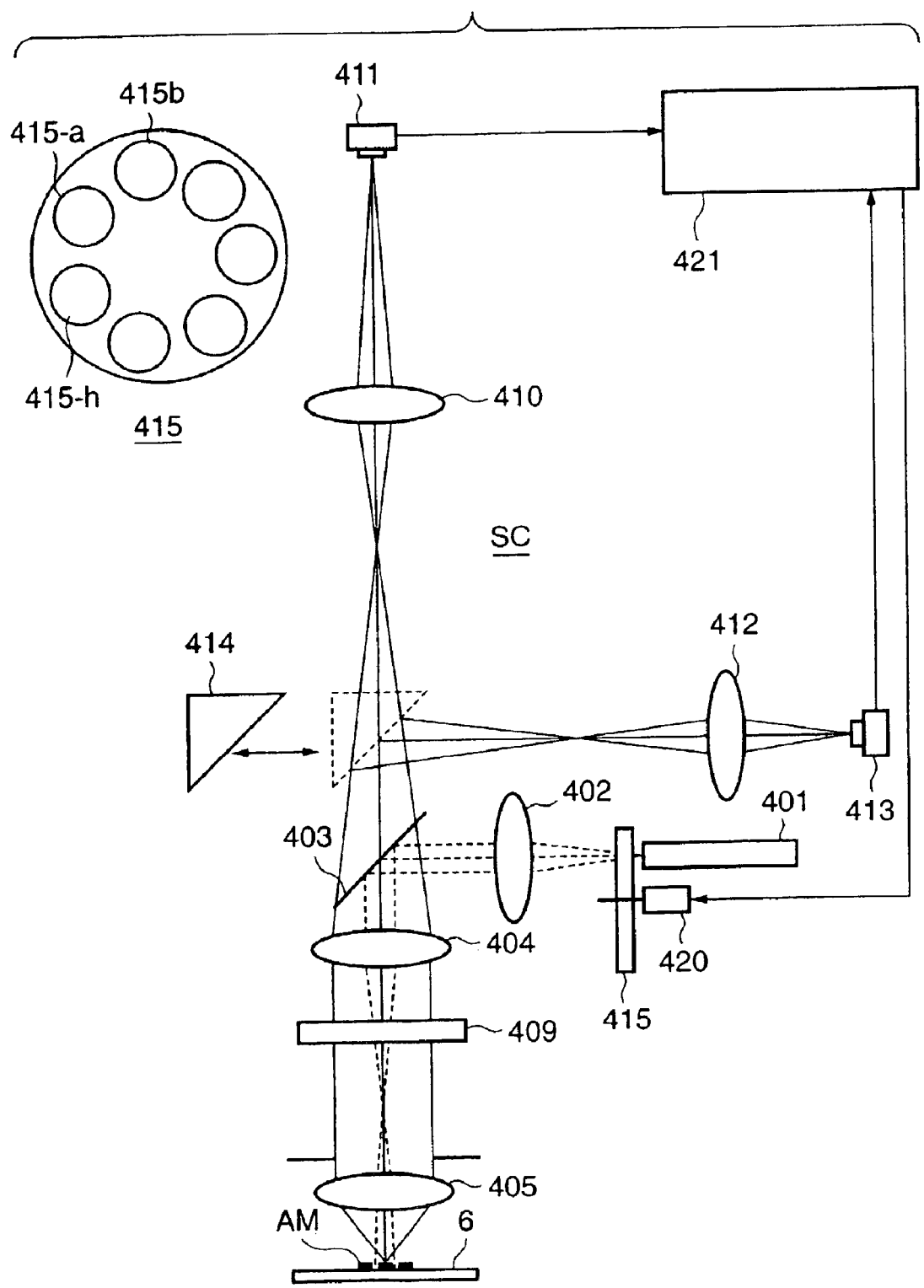
FIG. 21 is a view showing the schematic arrangement of a scope SC.

In the flow chart of FIG. 20, pre-alignment and global alignment are completely separated from each other. In alignment processing of this embodiment, global alignment is partially executed in pre-alignment measurement. For example, when pre-alignment is performed for F1, global alignment is sequentially executed for F1. Similarly, when pre-alignment is performed for F3, global alignment is sequentially executed for F3. This processing can shorten the stage moving distance and the time taken for alignment. This will be described in detail later with reference to the flow charts of FIGS. 9 and 10. If alignment is completed in this manner, the wafer undergoes exposure processing using a mask MASK and projection optical system LENS (S15).

An arrangement for further shortening the processing time in alignment processing of observing the alignment mark of FIG. 1 by low- and high-magnification detection systems will be explained in detail.

The wafer alignment scope SC shown in FIG. 4 allows simultaneously observing a mark at low and high magnifications to detect the mark position. Illumination light is guided from an alignment light source Li into the scope SC, and illuminates an alignment mark on the wafer W via a half-mirror M1 (or polarization beam splitter). For example, light illuminates the mark F1 in FIG. 5. Light reflected by the wafer W reaches high- and low-magnification detection sensors S2 and S1 via the half-mirror M1 and a half-mirror M2. A controller P determines the mark position on the basis of images or signals sensed by the sensors S1 and S2. A main controller MC sends a control signal to a driving unit MS so as to appropriately drive a stage STG on the basis of measurement result information from the controller P, stage position measurement information from a sensor LP, and the like.

Figure 6:
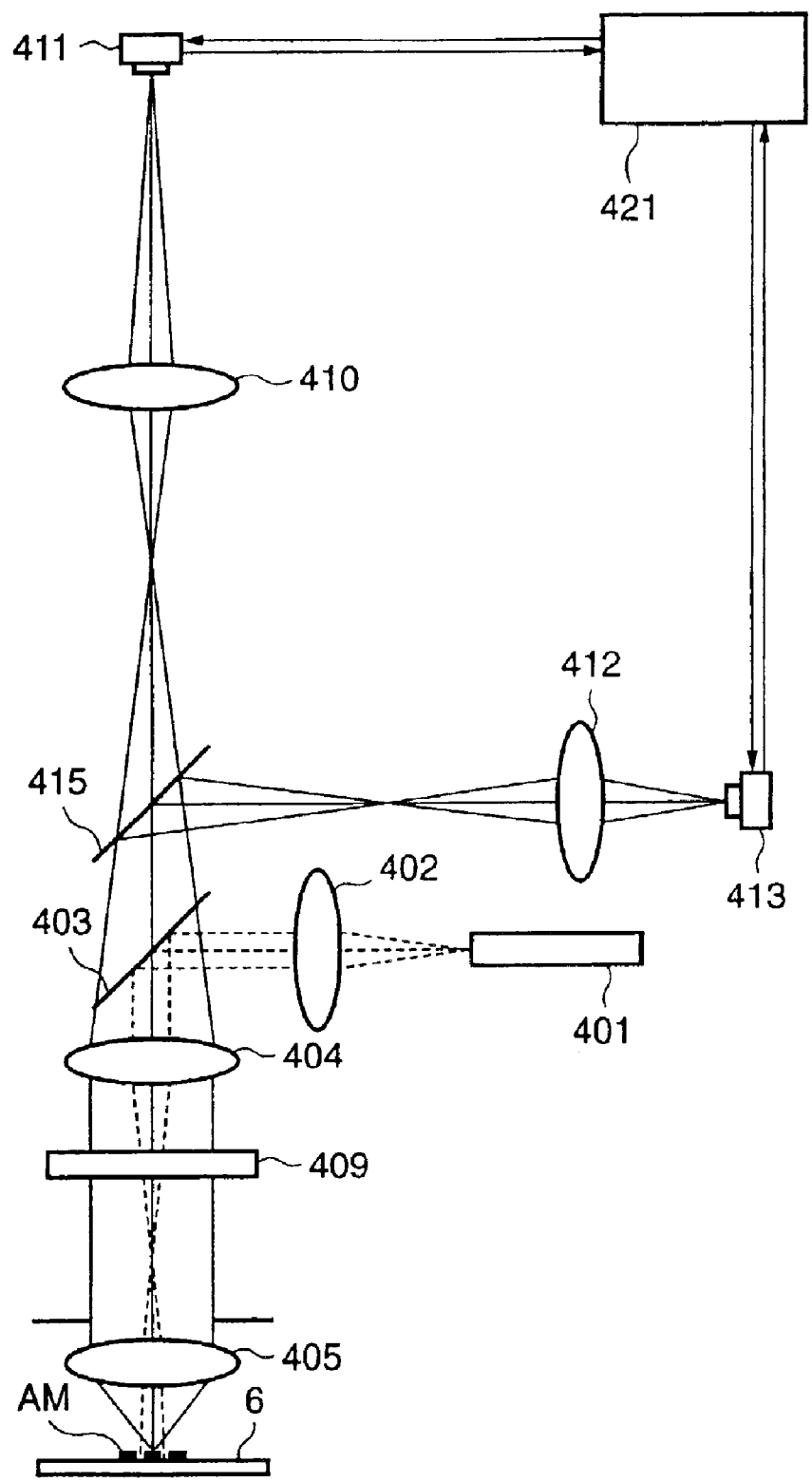
FIG. 6 is a block diagram showing the detailed arrangement of a scope SC shown in FIG. 4.

The sensor S1 includes a lens 410 and a photoelectric conversion element 411 (FIG. 6), and makes up a first detection system. The sensor S2 includes a lens 412 and a photoelectric conversion element 413, and makes up a second detection system. More specifically, as shown in FIG. 6, the first detection system which comprises the photoelectric conversion element 411 and an optical system including mirrors (403, 415) and lenses (404, 405, 410), performs low-magnification detection. Also, the second detection system which comprises a photoelectric conversion element 413 and an optical system including mirrors (403, 415) and lenses (404, 405, 412), performs high-magnification detection. Thus, the second detection system performs more accurate and precise detection of the position of the alignment mark than the first detection system.

FIG. 6 is a block diagram showing the detailed arrangement of the scope SC shown in FIG. 4. In FIG. 6, light guided from an illumination light source 401 (fiber or the like) is guided to a polarization beam splitter 403 (corresponding to the mirror Ml in FIG. 5) via an illumination optical system 402. S-polarized light reflected by the polarization beam splitter 403 to a direction perpendicular to the sheet surface of FIG. 6 passes through a relay lens 404 and λ/4 plate (¼-wavelength plate) 409. After that, light is circularly polarized and Köhler-illuminates an alignment mark AM formed on a wafer 6 via an objective lens 405.

Reflected light, diffracted light, and scattered light from the alignment mark AM on the wafer W return through the objective lens 405 and λ/4 plate 409, and are converted into P-polarized light parallel to the sheet surface of FIG. 6. Light split at a proper ratio by a half-mirror 415 (corresponding to the mirror M2 in FIG. 5) forms the image of the alignment mark AM on a photoelectric conversion element 411 (413) (variable storage time camera) via an imaging optical system 410 (412). The position of the wafer 6 is detected based on the position of the photoelectrically converted alignment mark image.

The split ratio of the half-mirror 415 is determined as follows. More specifically, light is split at a ratio corresponding to the square of the imaging magnification when an image is two-dimensionally detected at the same NA by using photoelectric conversion elements having the same photoelectric conversion efficiency. By determining the split ratio in this way, the same object can be observed at different magnifications with the same brightness. Also, in the first embodiment, the half-mirror 415 splits light at a ratio corresponding to the square of the imaging magnification on the assumption that the photoelectric conversion elements 411 and 413 have the same photoelectric conversion efficiency. This embodiment eliminates restrictions on the split ratio by using the variable storage time camera, which will be described later.

Figure 7A:
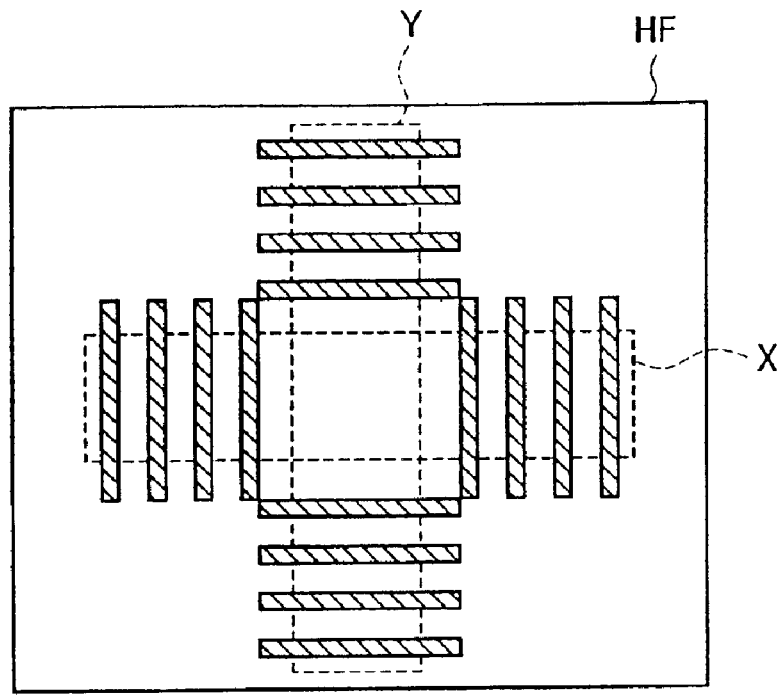
FIGS. 7A and 7B are views showing a state in which the alignment mark of FIG. 1 formed on a scribe line on a wafer is observed via the scope SC.
Figure 7B:
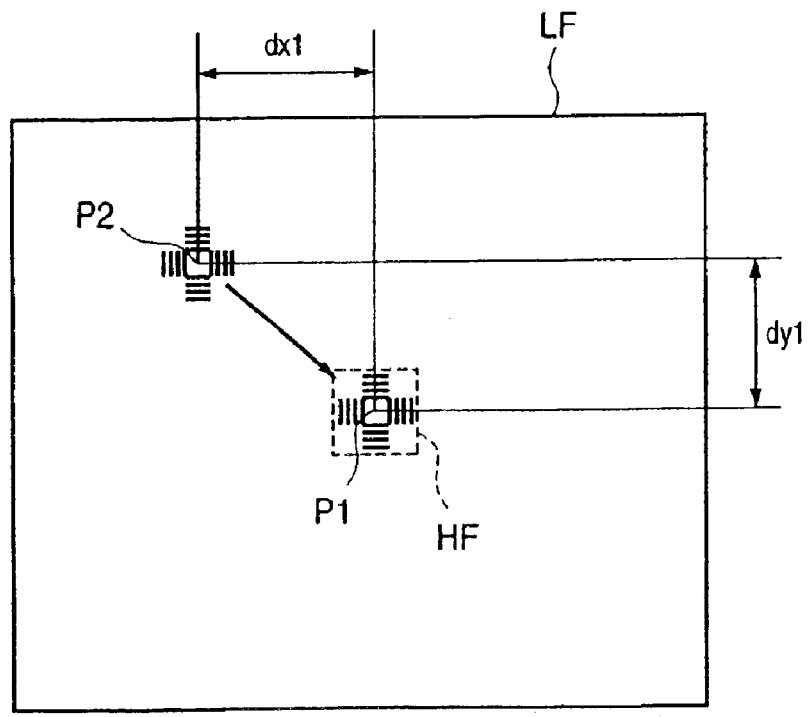

The imaging optical systems 410 and 412 will be described with reference to FIGS. 7A and 7B. FIGS. 7A and 7B are views showing a state in which the alignment mark of FIG. 1 formed on a scribe line on the wafer is observed via the scope SC. FIG. 7A schematically shows an observation field of view when an alignment mark which can be measured simultaneously in the X and Y directions is observed by the high-magnification detection systems 410 and 411. FIG. 7B schematically shows an observation field of view when the same alignment mark is observed by the low-magnification detection systems 412 and 413.

FIG. 7B shows a state in which the alignment mark is located at an initial position P2 when the alignment mark is moved to the observation field of view of the scope SC. After the initial position P2 is confirmed, the alignment mark is moved to a detectable region P1 of the high-magnification detection systems 410 and 411, as shown in FIG. 7B. In this case, the low-magnification detection systems 412 and 413 calculate distances dx1 to dy1 from the initial position P2 to the detectable region P1, which will be described later. The wafer stage (STG in FIG. 1) is driven based on the calculated dx1 and dy1 to move the alignment mark to the detectable region P1. The detectable region P1 means the position and range of a high-magnification detection field HF of view within a low-magnification detection field LF of view. This positional relationship may be adjusted by hardware in advance. Alternatively, the deviation of the center of the high-magnification field of view from the center of the low-magnification field of view may be stored as an offset in advance.

The stage STG is so moved as to position the alignment mark in the detectable region P1, and then the X and Y positions are detected by the high-magnification detection systems (410 and 411). A region represented by a broken line in FIG. 7A indicates a measurement window used to measure X and Y positions in global alignment. This region can also be detected as image data (one-dimensional waveform) accumulated and projected in a non-measurement direction. For example, an X measurement mark can be detected as a one-dimensional waveform accumulated in the Y direction. In this case, if the longitudinal line of the X measurement mark is jagged, the jaggies can be averaged by Y-direction accumulation.

As described above, the scope SC of the first embodiment enables observing an alignment mark almost simultaneously at low and high magnifications. The switching mirror 414 need not be driven, unlike the prior art, and the switching time between low and high magnifications can be shortened.

Figure 8:
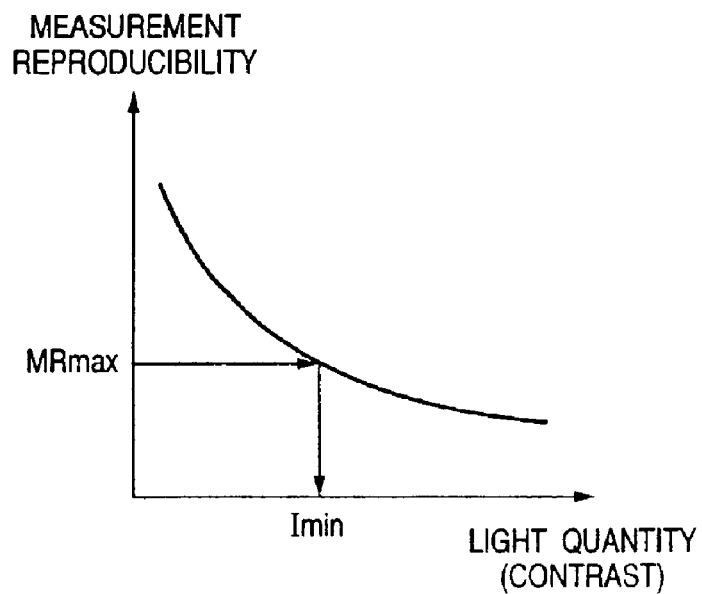
FIG. 8 is a graph showing the relationship between the light quantity and the measurement reproducibility.

The relationship between the light quantity of an alignment mark to be detected (or alignment mark signal contrast) and the measurement precision will be described with reference to FIG. 8. FIG. 8 is a graph showing the relationship between the light quantity and the measurement reproducibility by plotting the light quantity (or alignment mark signal contrast: denormalized) along the abscissa and the alignment mark measurement reproducibility (3σ:

higher precision for smaller σ) along the ordinate. As shown in FIG. 8, the measurement reproducibility can be increased by increasing the light quantity or contrast of an alignment mark to be detected. High-precision position detection can be achieved by detecting an alignment mark while maximizing the light quantity so as not to saturate the light quantity. In practice, to compensate for required measurement reproducibility ≦MRmax, a minimum value Imin of the light quantity (or contrast) is determined, and the light quantity is so determined as to measure a light quantity of Imin or more (details of which will be described later). In this fashion, the light quantity is adjusted (light control) so as to optimize the light quantity for each alignment. Light control must be individually performed for low- and high-magnification detection systems. This embodiment executes light control by using a variable storage time camera and setting the optimum storage time in photographing.

The optimum storage time is set as follows. An alignment mark at the first position on a wafer is detected by the detectors 411 and 413, and the detected alignment mark signals are sent to the controller 421 (corresponding to the controller P). The controller 421 calculates storage times optimum for the detectors 411 and 413 on the basis of the alignment mark signals (calculation method adopts, e.g., the following equation), and outputs the storage time information to the detectors 411 and 413. In detecting an alignment mark, the detectors 411 and 413 sense and measure the alignment mark for the set storage times, thereby measuring the alignment mark with the optimum light quantities.

As calculation of the storage time, an optimum light quantity is preferably obtained every time a signal subsequent to the signal of the alignment mark at the first position is detected. Considering an actual process wafer, light quantities (wafer reflectances) obtained from the wafer are almost the same in the same process. A given tolerance (allowance) set for the light quantity can decrease the storage time resetting frequency. Thus, the time taken to set the storage time can be substantially ignored.

In some cases, even the detection systems 411 and 413 adjusted to have the same light quantity by a design value suffer different light quantities between high and low magnifications on a wafer during an actual process. This is because an actual element pattern other than an alignment mark exists in the observation region of FIG. 7B. In the observation field of view for a high-magnification detection system in FIG. 7A, the light quantity can be determined by only the alignment mark. In the observation field of view for a low-magnification detection system in FIG. 7B, when a region (actual element region) around the alignment mark is bright, light control must be done including this bright region.

In other words, even if the split ratio of the half-mirror 415 is determined in the above-described manner to balance the light quantities of the detection systems 411 and 413 by design values, the high- and low-magnification light quantities must be optimized. In this sense, light control using the storage time can reduce the use frequency of the switching ND filter, resulting in high total throughput.

The light quantity difference between high and low magnifications has been explained to occur due to the difference in observation region, but may occur owing to different detection methods. For example, the light quantity changes when a high-magnification detection system is used for a bright observation field of view and a low-magnification detection system is used for a dark observation field of view. In this case, different NAs are selected, and the light quantity changes between the two detection systems even for the same mark.

The first embodiment is not limited to a plurality of detection systems having different imaging magnifications such as low and high magnifications, but can also be applied to achieve the effects of this embodiment for a plurality of detection systems using different detection methods such as detection of bright and dark fields of view, and a combination of two-dimensional detection and laser beam scanning.

Another merit in setting the storage time by the respective detection systems 411 and 413 is that the manufacturing error of the half-mirror 415 can be ignored. Assuming that the low magnification is ×10 and the high magnification is ×50, light must be split at a ratio of low magnification:high magnification=1:25 on the condition that photoelectric conversion elements have the same photoelectric conversion efficiency. This ratio is converted into the split ratio of the half-mirror 415 to yield low magnification:high magnification=about 3.8%:about 96.2%. In an actual half-mirror, the split ratio varies due to the film arrangement error of the mirror. An error of 1% generated in the mirror leads to (low magnification:high magnification= 3.8±1%:96.2±1%) and an error ratio of 1/3.8=26% for the low-magnification system. If this error amount is eliminated by a fixed attenuation element such as an ND filter, a light quantity of about 26% is wasted.

However, adjusting the above-mentioned storage time in this situation can remove the necessity for any hardware arrangement such as an attenuation element. The scope SC can be constituted without decreasing the dynamic range of the light quantity. More specifically, the same reflecting object is observed by low- and high-magnification systems for a given storage time, the obtained light quantities are calculated, and storage times are set based on these light quantities. For example, when the half-mirror exhibits low magnification:high magnification=2.8%:97.2%, a storage time longer by about 26% than the initial storage time is set as a default value for the low-magnification system. With this setting, the low- and high-magnification systems can detect the light quantity of the same light source as the same brightness.

Figure 9:
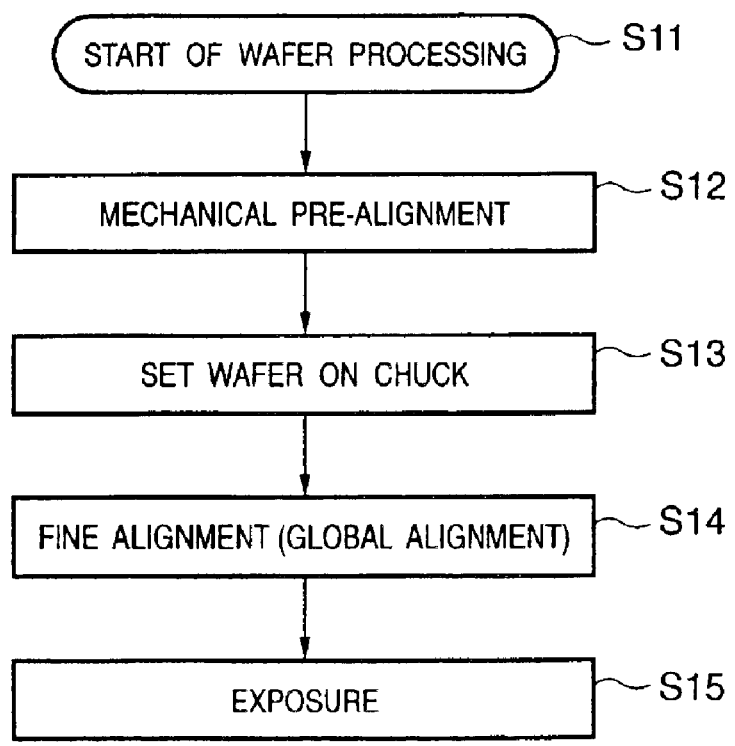
FIG. 9 is a flow chart for explaining alignment processing procedures according to the first embodiment.
Figure 10:
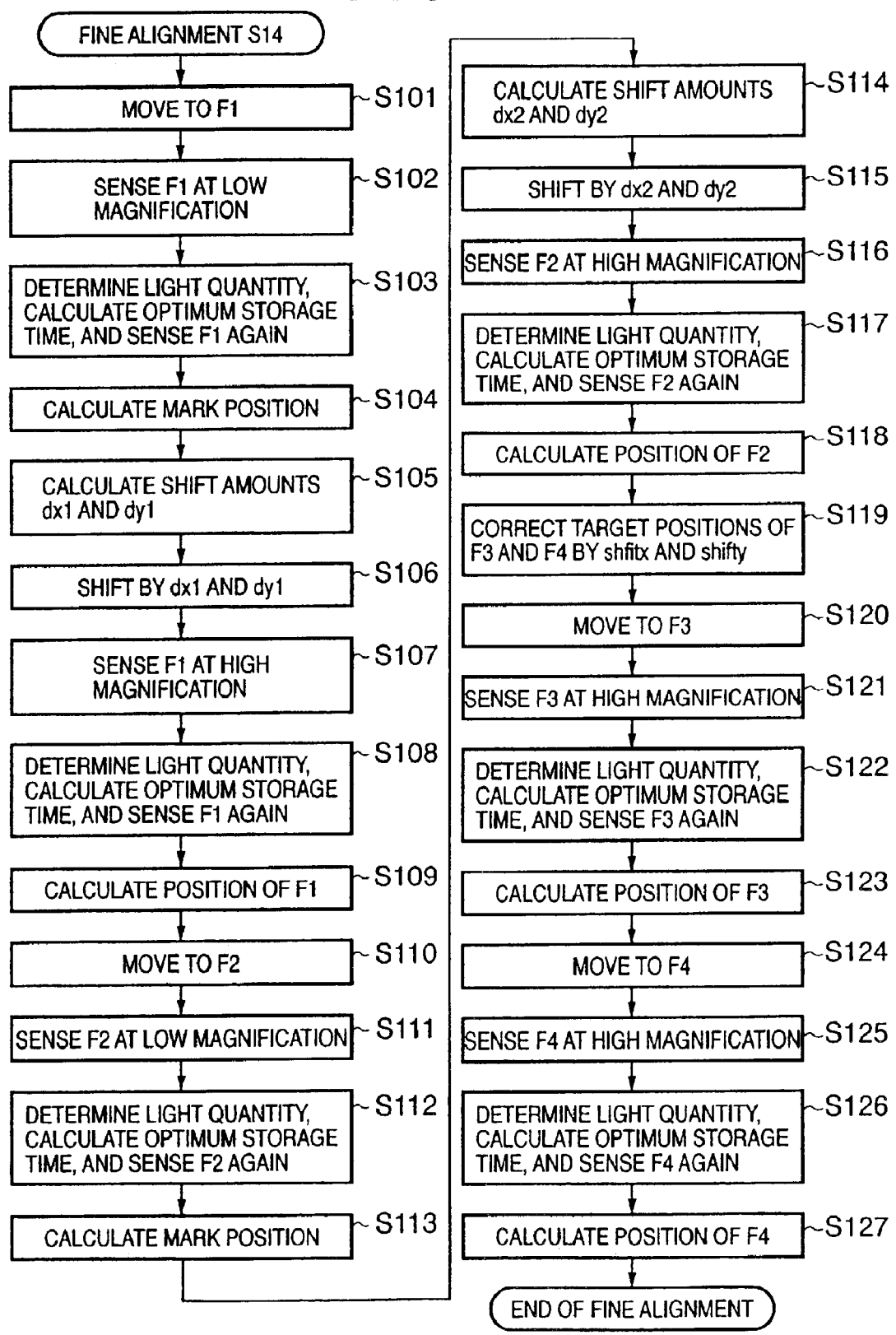
FIG. 10 is a flow chart for explaining alignment processing procedures according to the first embodiment.

Efficient alignment processing procedures using the alignment mark in FIG. 1 will be explained. FIGS. 9 and 10 are flow charts for explaining alignment processing procedures according to the first embodiment. A wafer which has mechanically been aligned in step S12 and is set on the chuck in step S13 undergoes fine alignment (step S14). In fine alignment, the wafer is moved to a position where the mark F1 can be observed by at least the low-magnification detection system (step S101). The mark F1 is sensed at a low magnification by the low-magnification detection system (sensor S1 and photoelectric conversion element 413) (step S102). Whether the light quantity of the sensed image is proper is checked, and if necessary, the storage time is changed and the mark F1 is sensed again.

Figure 11:
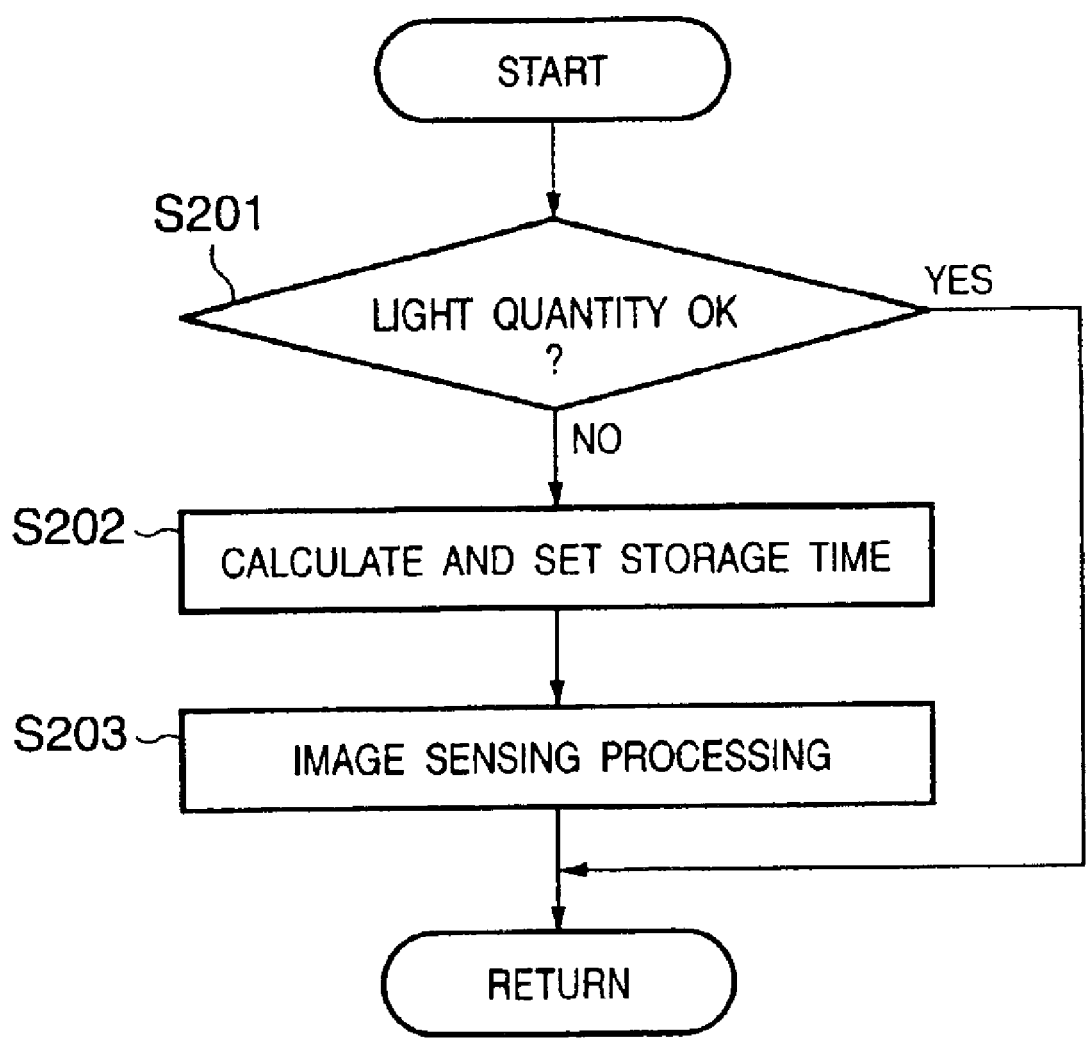
FIG. 11 is a flow chart showing processing contents in step S103 in detail.

FIG. 11 is a flow chart showing processing contents in step S103 in detail. Whether the light quantity is proper is determined (tolerance determination) by checking whether the light quantity falls within a predetermined range (step S201). If the mark is not sensed by a light quantity appropriate for the low-magnification detection system, an optimum storage time is calculated (calculation method adopts, e.g., the following equation) (step S202). Then, the alignment mark F1 is sensed again for the calculated optimum storage time (step S203). If the light quantity is determined to be proper in light quantity tolerance determination, the processing in FIG. 11 ends, and the flow shifts to step S104 in FIG. 10.

The mark position of the alignment mark F1 is calculated based on the image sensed for the storage time with which the light quantity is determined to be proper. In this way, pre-alignment measurement is done (step S104).

If the mark position calculated by the above processing is determined to shift from the target by dx1 in the X direction and dy1 in the Y direction (step S105), the wafer position is moved by dx1 and dy1 so as to fall within the field of view of the high-magnification detection system (step S106). In this state, the alignment mark F1 falls within the field of view of the high-magnification detection system. The mark F1 is sensed using the high-magnification detection system (sensor S2 and photoelectric conversion element 411) (step S107). Whether the light quantity is proper for the high-magnification detection system is checked. If the light quantity is not proper, an optimum storage time is calculated, and the alignment mark image is sensed again by the high-magnification detection system (step S108). The processing in step S108 is the same as that described in the flow chart of FIG. 11. The mark position of the alignment mark F1 is calculated from the image sensed with the optimum light quantity, and global alignment measurement is completed for the alignment mark F1 (step S109).

In steps S110 to S118, the same processes as those in steps S101 to S109 are executed for the alignment mark F2 to calculate the mark position of the alignment mark F2. By this processing, global alignment measurement is completed for the alignment marks F1 and F2, accurately obtaining their X and Y positions. After the two mark positions are calculated, the θ component and the shift (shift X and shift Y) of the center upon setting the wafer on the chuck can be determined. In alignment mark measurement, the precision is higher as the interval between two marks to be measured is larger, as described above. In other words, the precision is higher when F3 is measured subsequently to F1. In this case, however, the mark F2 is observed instead of the mark F3 in consideration of the throughput.

The target positions of the unmeasured marks F3 and F4 are corrected by θ, shift X, and shift Y (step S119), and high-magnification processing is sequentially performed for F3 and F4 (steps S120 to S127). Movement to the marks F3 and F4 (steps S120 and S124) uses the target positions corrected in step s119, and the marks F3 and F4 can be moved to positions where they can be reliably sensed and measured by the high-magnification detection system. Thus, the marks F3 and F4 directly undergo global alignment measurement by high-magnification image sensing. In calculating the positions of the marks F3 and F4, the marks F3 and F4 need not be observed by the low-magnification detection system because the target positions of the marks have already been corrected. Image sensing of the marks F3 and F4 by the high-magnification detection system (steps S121 and S125), determination of the light quantity, calculation of an optimum storage time, and sensing of the marks F3 and F4 again (steps S122 and S126), and position calculation of F3 and F4 (steps S123 and S127) are the same as steps S107, S108, and S109.

The above processing eliminates processing of moving the mark position to the conventional pre-alignment positions PAL and PAR and obtaining the mark position. Consequently, the stage moving time can be shortened.

The light quantity is determined for all the marks F1 to F4. By giving the light quantity a tolerance (allowance), as described above, the storage time switching frequency can be decreased for the same wafer and the same process wafer. A decrease in throughput by the driving time can therefore be suppressed in comparison with conventional control of switching the ND filter every time the high- and low-magnification detection systems are switched using the switching ND filter 415. The storage time can be changed as described above to increase the throughput.

Alignment processing using the alignment mark in FIG. 1 has been described. Alignment processing using the alignment marks in FIGS. 2A to 3B will be explained.

FIG. 12 is a view showing a wafer substrate on which the alignment mark shown in FIG. 3A is formed. The alignment marks shown in FIGS. 2A, 2B, 3A, and 3B contain X measurement marks (X1 to X4) and Y measurement marks (Y1 and Y2) so as to enable pre-alignment, but global alignment uses only X measurement marks. Hence, as shown in FIG. 12, global alignment adopts a set of the mark shown in FIG. 3A and a mark rotated through 90°, such as FX1 and FY1, or FX2 and FY2. The alignment mechanism is the same as that shown in FIGS. 4 and 6.

If the wafer W is supplied to a semiconductor manufacturing apparatus, the mechanical alignment apparatus MA mechanically aligns the wafer W by using the periphery of the wafer and an orientation flat or notch (notch N is shown in FIG. 12) to determine the rough position of the wafer W (step S02). Then, the wafer is set on the chuck CH by a wafer supply apparatus (not shown) (step S03), and pre-aligned by a low-magnification detection system (step S04). Pre-alignment uses FX1 and FX3, or FY1 and FY3 shown in FIG. 12. In pre-alignment, each mark is sensed using the low-magnification detection system of the scope SC. The mark position is obtained by pattern matching to detect the center of the wafer. The pre-alignment precision is higher as the interval between two marks to be measured is larger. Finally, global alignment is performed to accurately obtain the wafer position and exposure shot position (step S05). In global alignment, a plurality of global alignment marks FX1 to FX4 and FY1 to FY4 on the wafer are measured using a detection system having a higher magnification than in pre-alignment. X- and Y-direction shifts of the wafer W, the rotational component, and the magnification component of the shot array are obtained.

The first embodiment shortens the alignment processing time by performing global alignment measurement to the extent possible in pre-alignment measurement of FX1 and FX3. The processing procedures will be explained with reference to FIGS. 9 and 13.

Figure 13:
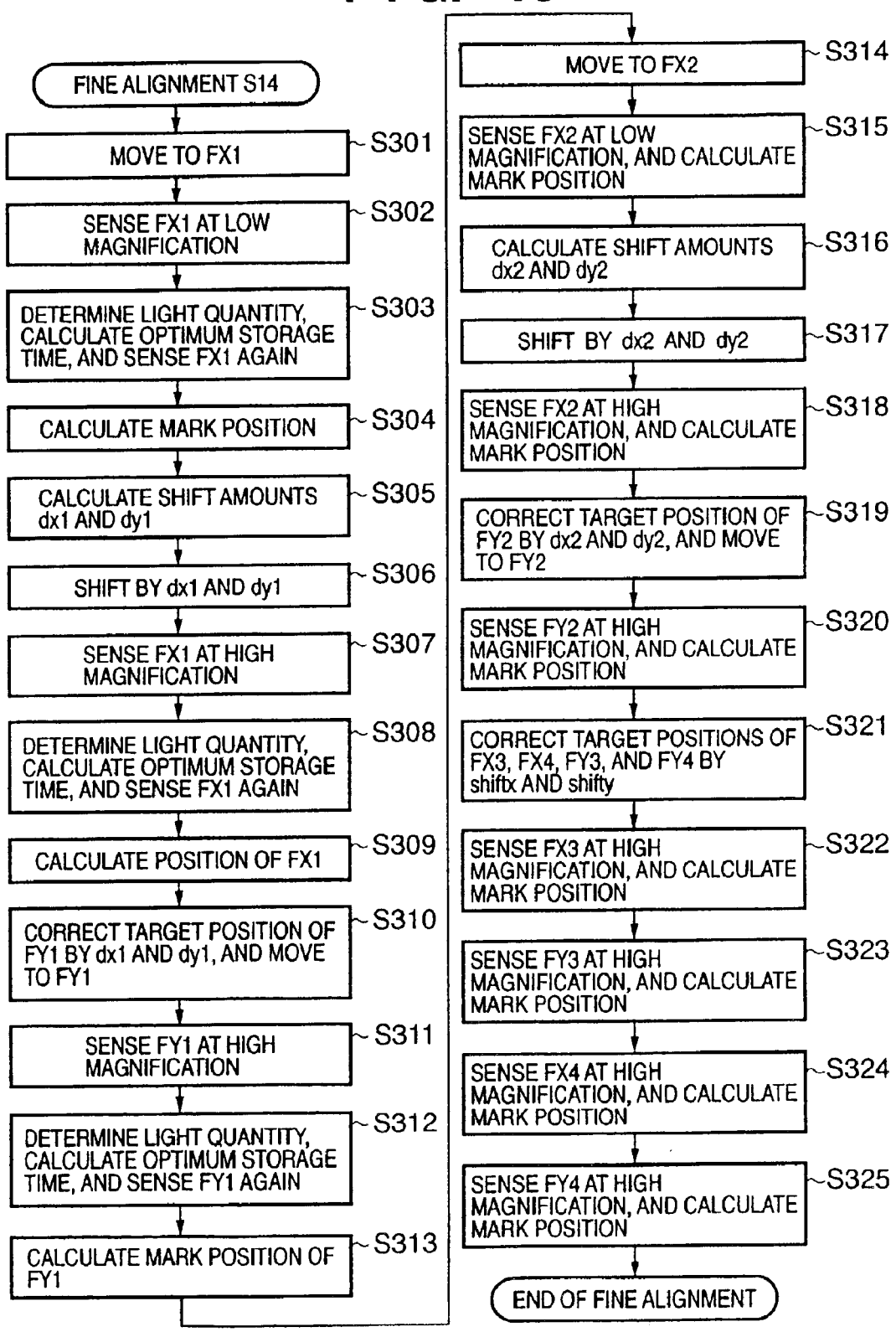
FIG. 13 is a flow chart for explaining alignment processing procedures corresponding to the alignment mark shown in FIG. 12.

Processes in steps S12 and S13 shown in FIG. 9 have been described above. In fine alignment of step S14, the processing shown in FIG. 13 is executed.

The wafer is moved to a position where the mark FX1 enters the field of view of the low-magnification detection system. The mark FX1 is sensed by the low-magnification detection system (step S302). The tolerance of the light quantity of the sensed image is checked, and if the light quantity is not proper, an optimum storage time is calculated and the mark FX1 is sensed again (step S303: FIG. 11). The mark position is calculated based on the image which has passed light quantity determination (step S304). If the above processing reveals that the mark position shifts from the target by dx1 in the X direction and dy1 in the Y direction (step S305), the wafer position is moved by dx1 and dy1 so as to fall within the field of view of the high-magnification detection system (step S306). In this state, the alignment mark FX1 falls within the field of view of the high-magnification detection system. The mark FX1 is sensed using the high-magnification detection system (step S307). Whether the light quantity is proper for the high-magnification detection system is checked. If the light quantity is not proper, an optimum storage time is set, and the mark image is sensed again at a high magnification (step S308: FIG. 11). The mark position of FX1 is calculated from the sensed image (step S309).

The target position of the alignment mark FY1 is corrected using dx1 and dy1 calculated in step S305, and the mark FY1 is moved to this position (step S310). Since FX1 and FY1 are close to each other, they are hardly influenced by the θ component upon setting the wafer on the chuck. Thus, the mark FY1 can be moved to the field of view of the high-magnification detection system. The mark FY1 is immediately sensed by the high-magnification detection system, the light quantity is determined, and the mark position of the alignment mark FY1 is calculated (steps S311 to S313). Processes in steps S311 to S313 are the same as those in steps S307 to S309 except that the object to be measured is the mark FY1.

After movement to the position of the alignment mark FX2, the positions of the alignment marks FX2 and FY2 are calculated by the same processing as that for the alignment marks FX1 and FY1 (steps S314 to S320).

After two mark positions, i.e., mark positions "FX1, FY1" and "FX2, FY2" are calculated, the θ component and the shift (shift X and shift Y) of the center upon setting the wafer on the chuck can be determined. The target positions of the alignment marks FX3, FX4, FY3, and FY4 which have not undergone global alignment measurement are corrected for θ, shift X, and shift Y (step S321). The alignment marks FX3, FY3, FX4, and FY4 are detected by the high-magnification detection system to perform determination of the light quantity and position calculation (steps S322 to S325). That is, the same processes as those in steps S307 to S309 are sequentially executed for the alignment marks FX3, FY3, FX4, and FY4. These alignment marks need not be observed at a low magnification because their target positions are accurately corrected in step S321.

This method can process the wafer without moving the mark position to PAL and PAR, unlike the prior art which moves the mark position to the positions PAL and PAR to perform pre-alignment. This method can shorten the stage moving time in alignment processing.

Whether the light quantity is proper is checked in sensing all the alignment marks. In general, once the storage time is optimized, an appropriate light quantity is obtained, and the storage time switching frequency decreases for the same wafer and the same process wafer. In the prior art, the switching driving time of the switching ND filter decreases the throughput. To the contrary, changing the storage time in the above fashion can increase the throughput.

The arrangement shown in FIG. 4 has been described by exemplifying an off-axis alignment semiconductor manufacturing apparatus. This arrangement can be applied to any type such as the TTL alignment type or the TTR alignment type in which a wafer mark is observed through a reticle (mask) as far as a scope capable of observing a mark simultaneously at low and high magnifications is used and the mark can be shared between pre-alignment and global alignment.

<Second Embodiment>

Figure 14:
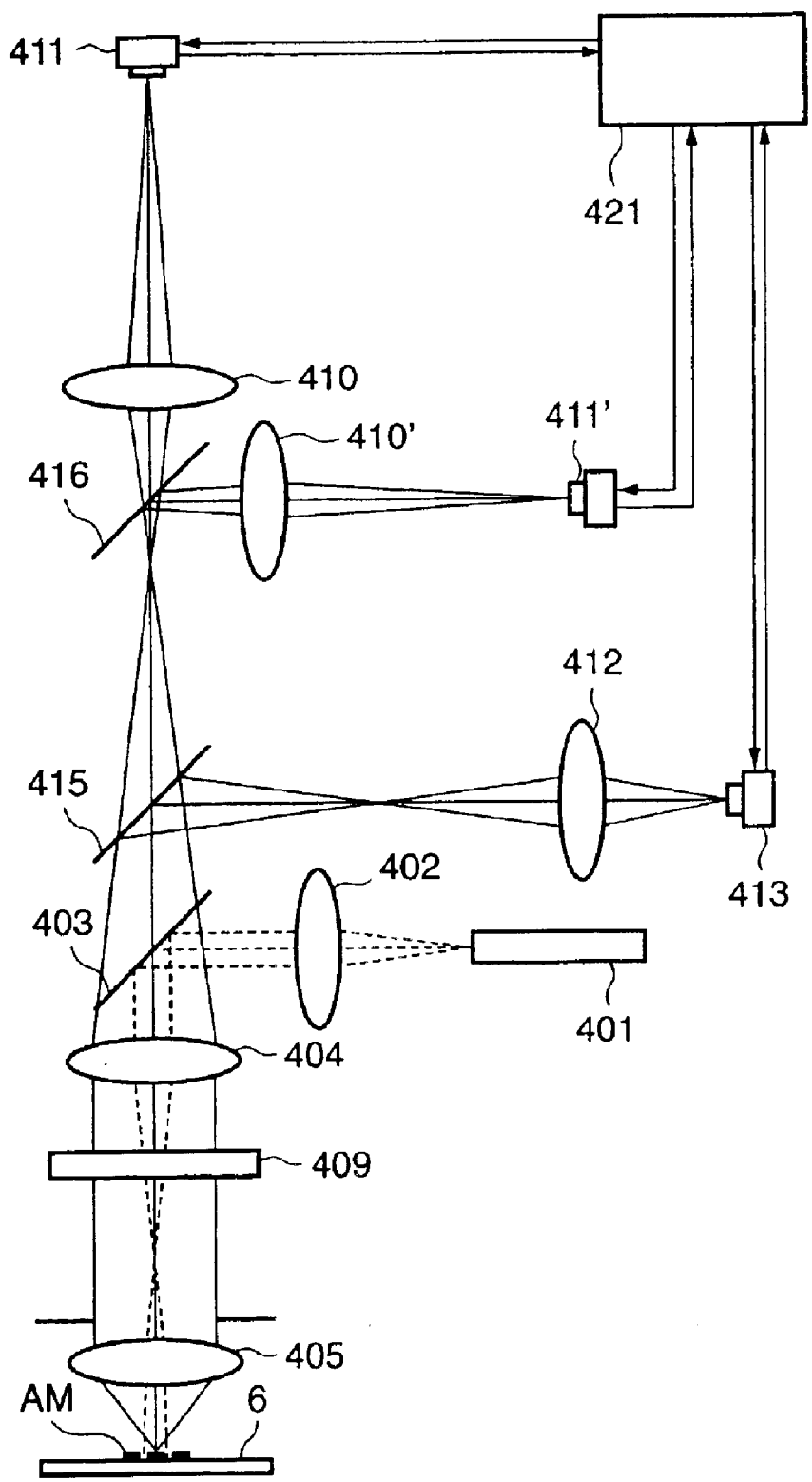
FIG. 14 is a block diagram showing the detailed arrangement of a scope according to the second embodiment.

Another embodiment of the alignment scope will be described with reference to FIG. 14. The alignment scope of FIG. 14 is different from that of FIG. 6 in that the high-magnification detection system constitutes X and Y independent detection systems (410 and 411, and 410' and 411'). The remaining arrangement in FIG. 14 has already been described in FIG. 6, a detailed description thereof will be omitted, and only the difference will be explained.

Light which is split by a half-mirror 415 and passes through it is split into two by a second half-mirror 416 arranged on the high-magnification detection system side. Light reflected by the half-mirror 416 is guided to the photoelectric conversion element (variable storage time camera) 411' via the high-magnification detection imaging optical system 410' dedicated for X measurement, and forms the image of an alignment mark AM on the element. Light having passed through the half-mirror 416 is guided to the high-magnification detection imaging optical system 410 dedicated for Y measurement, and forms the image of the alignment mark AM on the variable storage time camera 411, similar to X measurement. In either case, the alignment mark position is calculated on the basis of a signal photoelectrically converted by the photoelectric conversion element, which is the same as the above-described embodiment.

Also similar to the above-described embodiment, image signals obtained from the photoelectric conversion elements 411 and 411' are sent to a controller 421, and the controller 421 calculates an optimum storage time from the signal intensities. The photoelectric conversion elements 411 and 411' can sample image data on the basis of the optimum storage time calculated by the controller 421.

Figure 15:
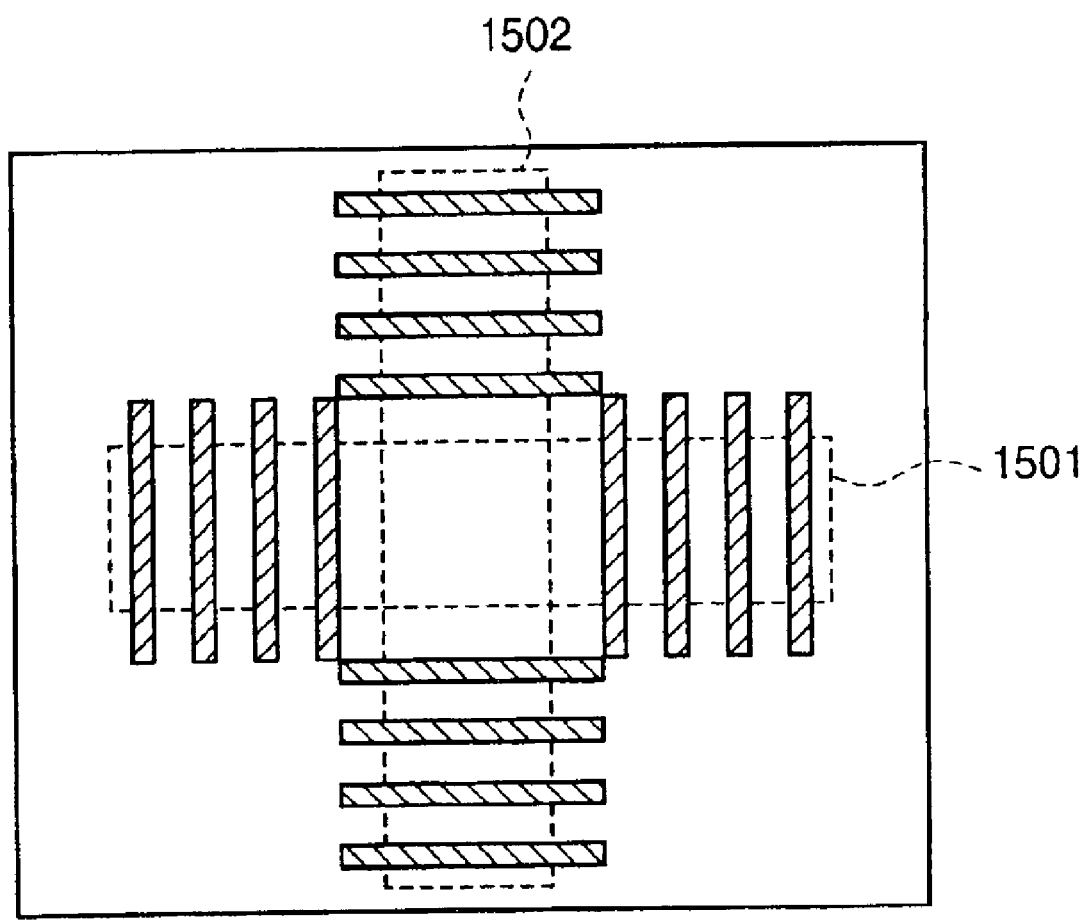
FIG. 15 is a view for explaining a state in which the light quantity is different between X and Y alignment mark detection systems.

A case in which the light quantity (optimum storage time) is different between the X and Y detection systems will be explained in detail with reference to FIGS. 15 to 16D.

In FIG. 7A, the mark is expressed on the assumption that X and Y measurement marks have the same brightness. In FIG. 15, the Y measurement mark (painted mark) is higher in mark signal intensity than the X measurement mark (hatched mark). For illustrative convenience, a bright portion is black in FIG. 15. These X and Y measurement marks exhibit different brightness levels when, for example, they are formed on the wafer W by different processes.

Figure 16A:
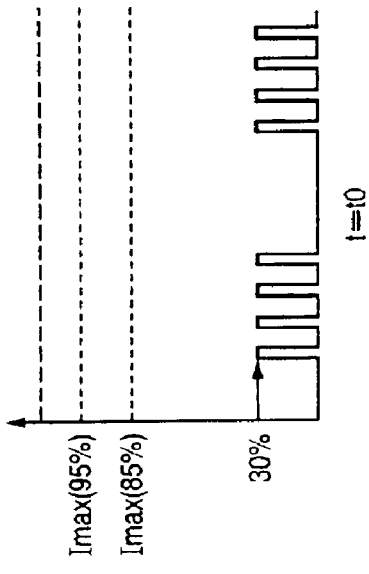
FIGS. 16A to 16D are graphs for explaining the state in which the light quantity is different between the X and Y alignment mark detection systems.
Figure 16B:
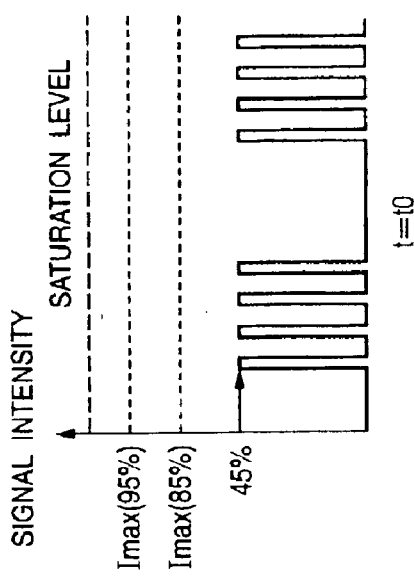
Figure 16C:
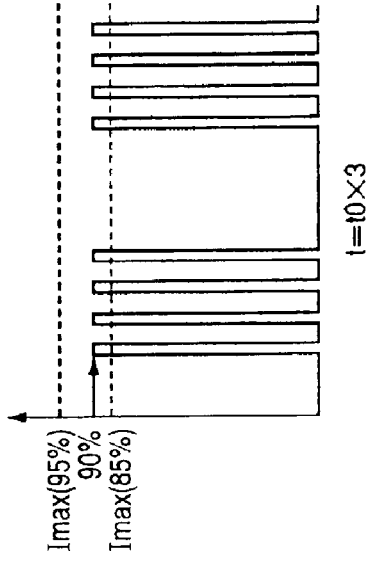
Figure 16D:
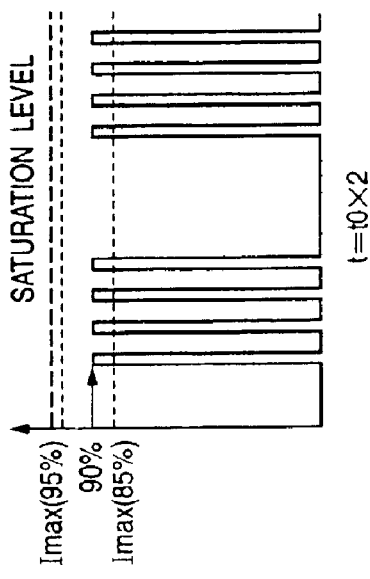

FIGS. 16A to 16D schematically show the detection signal intensity of the detected alignment mark AM. FIGS. 16A and 16C show a Y signal, and FIGS. 16B and 16D show an X signal. In the second embodiment, the storage time is optimized using a signal intensity within a window 1501 for the X measurement-dedicated high-magnification detection system, and a signal intensity within a window 1502 for the Y measurement-dedicated high-magnification detection system. FIGS. 16A and 16B show signals detected when no optimum condition for the storage time is found. FIGS. 16A and 16B show the signals of the alignment mark AM received after a given storage time t0. If X and Y light quantities are different from each other for the same storage time, storage times optimum for the respective detection systems are calculated. For example, in FIGS. 16A to 16D, the optimum storage time is set to 2×t0 for the Y signal and 3×t0 for the X signal.

As described in the above embodiment, the minimum light quantity tolerance Imin is set in advance for the necessary measurement reproducibility MRmax. The maximum light quantity tolerance Imax is set by giving a specific margin to the saturation level of the signal intensity. Note that Imax may be set to the saturation level. The minimum and maximum values Imin and Imax of the light quantity are set in advance, the light quantity is determined using them, and if the light quantity falls outside the tolerance, an optimal storage time is calculated.

In the example of FIG. 16A, Imin and Imax are respectively set to 85% and 95% the saturation level. After the initial storage time for Y measurement, the light quantity is 45%, which does not reach Imin. By doubling the light quantity, this signal can be detected as a signal having a large light quantity (high contrast) smaller than Imax (FIG. 16C). The target value of the storage time may be set to Imax, Imin, or the average of them as far as the storage time falls within the range of Imin to Imax.

For X measurement, the obtained light quantity is 30%. By tripling the light quantity, measurement can be done with the same light quantity (contrast) as that of Y measurement. In light control, therefore, a storage time twice the initial storage time t0 is set for Y measurement, whereas a storage time three times the initial storage time t0 is set for X measurement. Images are captured again to measure positions at the optimum signal intensities. This state is shown in FIGS. 16C and 16D.

Letting I be the light quantity obtained in the initial storage time t0, and (Imax+Imin)/2 be the final target value, the optimum storage time can be calculated by t=(Imax+Imin)/2/I×t0. The optimum storage time is not limited to this equation and can be calculated by another equation. In short, the storage time suffices to fall within the tolerance.

The storage times of respective photoelectric conversion elements can be set even when different optimum storage times are required in the X and Y directions. The switching ND filter need not be switched between X and Y, and the throughput can be increased.

Figure 17:
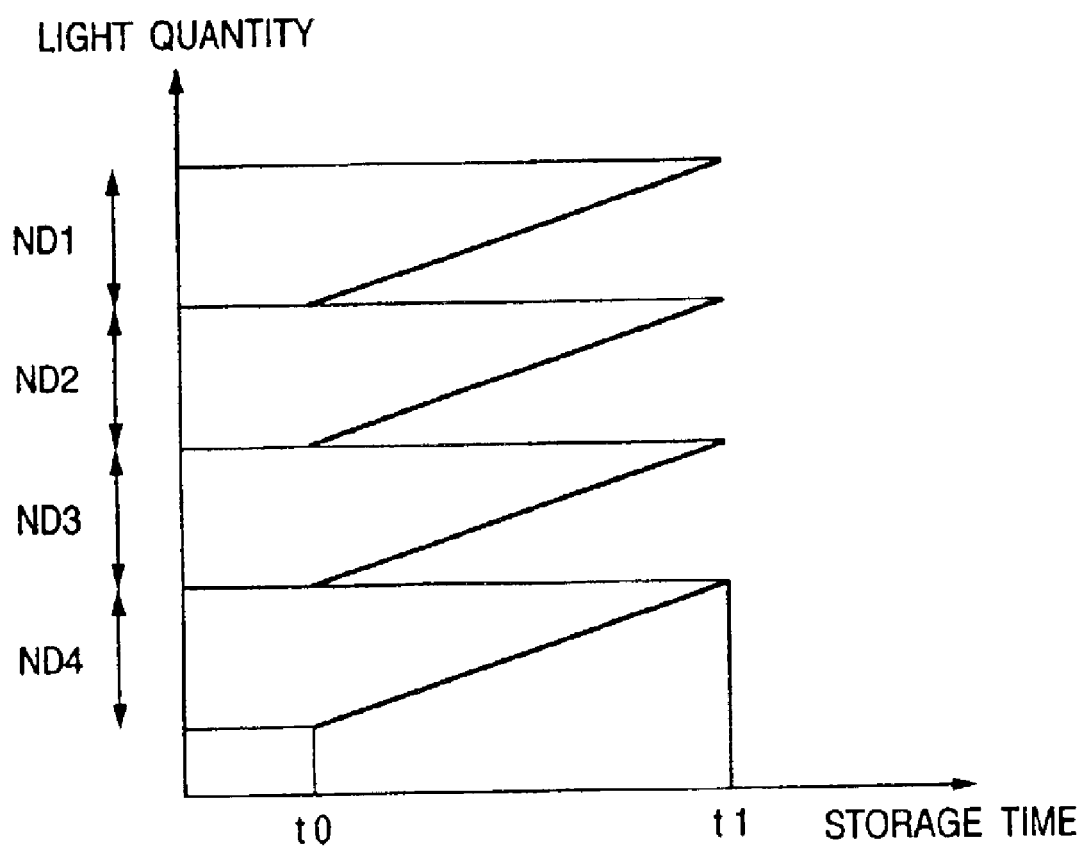
FIG. 17 is a graph for explaining light quantity control by switching an ND filter and adjusting the storage time.
Figure 18:
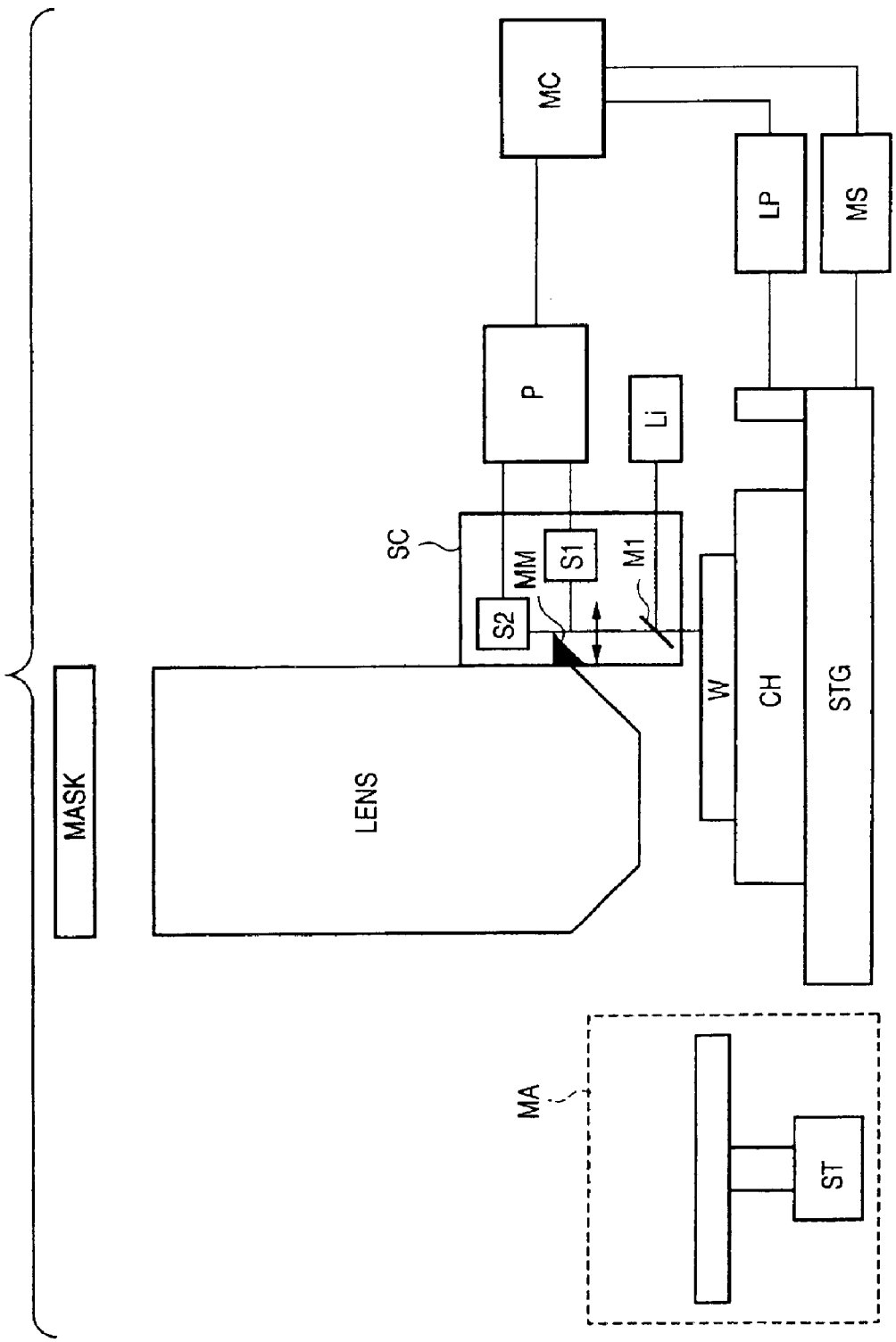
FIG. 18 is a block diagram for explaining the arrangement of a general alignment mechanism.
Figure 19:
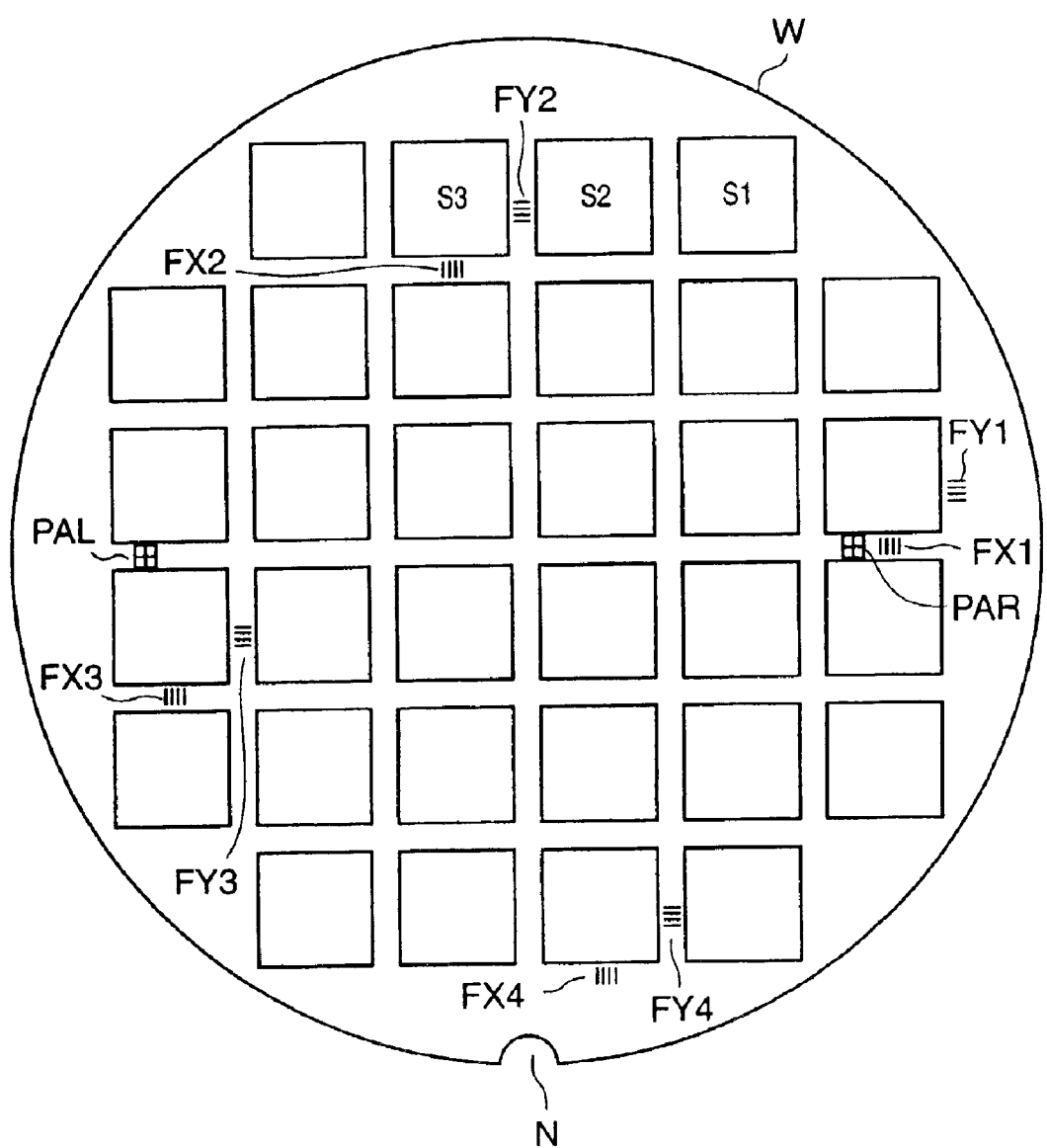
FIG. 19 is a view showing a wafer on which an alignment mark is formed.

In the above-described embodiments, no switching ND filter is used. However, the use of the switching ND filter can widen the dynamic range of light quantity adjustment without prolonging the storage time. In FIG. 17, the abscissa represents the storage time, and the ordinate represents the light quantity. The storage time is changed from t0 to t1, and ND filters ND1 to ND4 are so constituted as to complement the storage time. This setting can continuously adjust the light quantity. For example, if the storage time is changed from t=t0 to 2×t0, the ND filters are constituted to ND1= 100%, ND2=50%, ND3=25%, and ND4=12.5%, thus realizing continuous light control. Even in the arrangement of discrete ND filters, light control using the storage time can achieve strict light control and higher-precision position detection.

When the switching ND filter is used, the throughput can be increased as long as the light quantity is the same between X and Y or only the storage time can be changed with the same ND filter. By optimizing the storage time setting range and the arrangement of the ND filter, the switching frequency of the switching ND filter can be minimized. Light control can be performed without excessively prolonging the storage time.

Although the X and Y position detection systems have been described, the present invention is not limited to them and can be applied to a focus detection system which measures the level of the wafer surface. In other words, the present invention can be applied to a measurement system in which the storage time can be changed for a plurality of photoelectric conversion elements of a detection system and a mark can be measured for optimum storage times.

In the above embodiments, the photoelectric conversion elements 411 and 413 sense an image to generate image signal, and the position of the mark can be calculated by performing image processing. However, the photoelectric conversion elements 411 and 413 may, for example, be a linear sensor. In this case, the position of the mark can be detected by processing signals obtained by sensing the alignment mark.

In the above embodiments, the signal intensity for detecting a mark is adjusted by adjusting the storage time of each photoelectric conversion element. Alternatively, a light quantity which reaches each photoelectric conversion element may be adjusted. This can be realized by, for example, arranging a plurality of types of filters having different transmittances for respective photoelectric conversion elements and selecting one of the filters. In the case of the above embodiments, independent switching ND filters are arranged for low- and high-magnification detection systems (or X and Y-dedicated high-magnification detection systems). In this case, the mechanism of the apparatus becomes more complicated and more bulky than the above embodiments in which the storage time can be set in each detection system. In addition, the switching time of the ND filter may decrease the throughput. In this sense, adjustment by changing the storage time in the above embodiments is preferable. Alternatively, the signal intensity for detecting a mark may be adjusted by adjusting the amplification factor of an output electrical signal from the photoelectric conversion element. The amplification factor of a signal amplifier circuit for each photoelectric conversion element is set independently adjustable. This enables adjusting the signal intensity and increasing the measurement reproducibility.

As described above, the above embodiments employ a mark which allows measuring both pre-alignment and global alignment. Since the same mark can be simultaneously observed at low and high magnifications to measure the position, the conventional pre-alignment processing time can be shortened. In particular, the use of the variable storage time camera for a plurality of photoelectric conversion elements realizes light control without any driving system such as a switching ND filter. The throughput can be increased, and an increase in apparatus size can be prevented. The light quantity can be strictly adjusted for respective detection systems by adjusting the storage time, and higher-precision position detection can be achieved.

The use of the switching ND filter and light control adopting the storage time can widen the dynamic range of light quantity adjustment. By using the variable storage time camera, the transmittance error in manufacturing the half-mirror M2 can be compensated for, and wider-dynamic-range light control can be performed.

<Description of Semiconductor Manufacturing Process>

Figure 22:
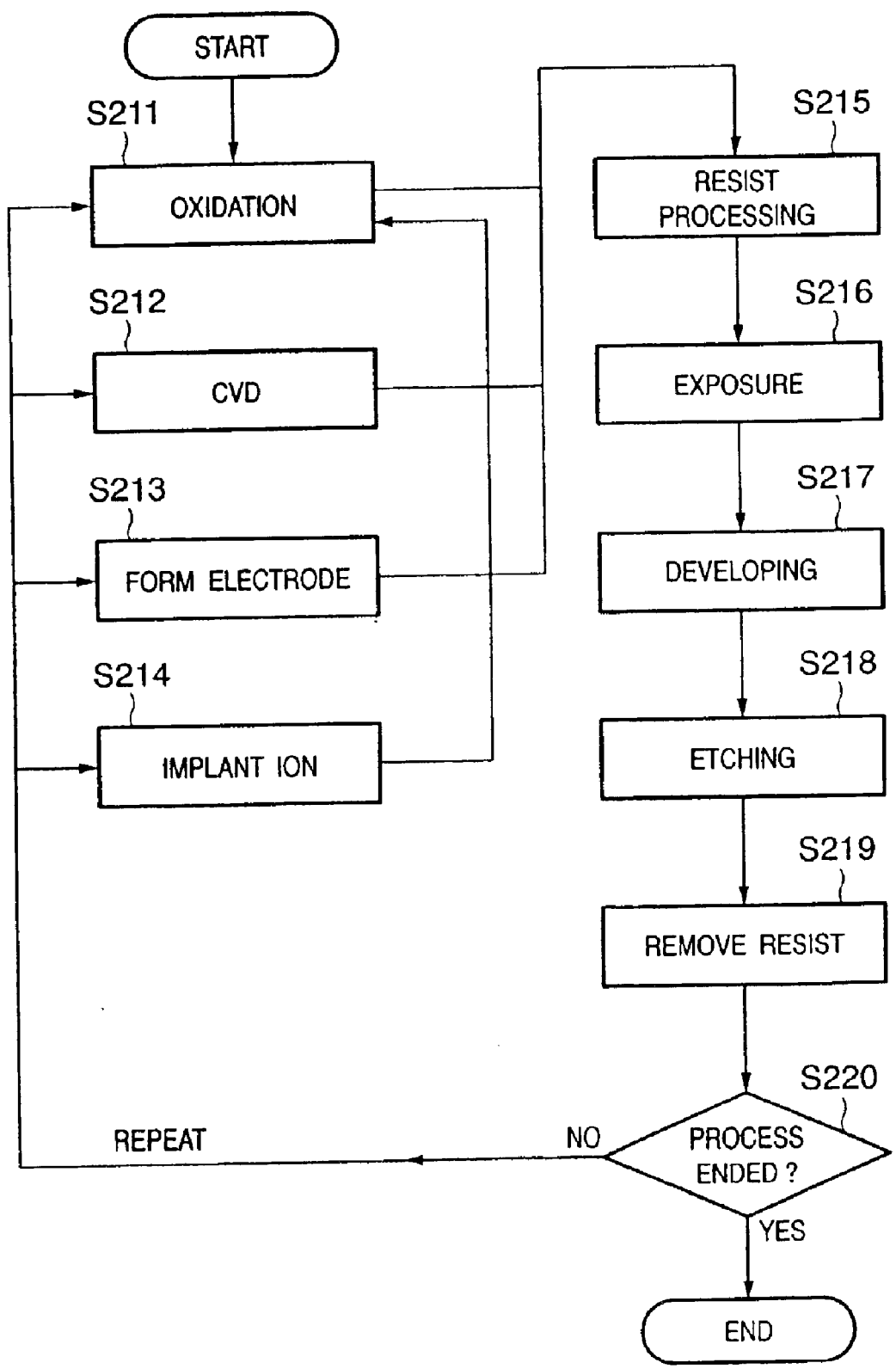
FIG. 22 is a flow chart showing the flow of the whole manufacturing process of a semiconductor device.

A semiconductor device manufacturing process using the above-described exposure apparatus will be explained. FIG. 22 shows the flow of the whole manufacturing process of a semiconductor device. In step S201 (circuit design), a semiconductor device circuit is designed. In step S202 (mask formation), a mask having the designed circuit pattern is formed. In step S203 (wafer formation), a wafer is formed by using a material such as silicon.

In step S204 (wafer process) called a pre-process, an actual circuit is formed on the wafer by lithography using the prepared mask and wafer. Step S205 (assembly) called a post-process is the step of forming a semiconductor chip by using the wafer formed in step S204, and includes an assembly process (dicing and bonding) and packaging process (chip encapsulation). In step S206 (inspection), the semiconductor device manufactured in step S205 undergoes inspections such as an operation confirmation test and durability test. After these steps, the semiconductor device is completed and shipped (step S207).

The pre-process and post-process are performed in separate dedicated factories, and each of the factories receives maintenance by the above-described remote maintenance system. Information for production management and apparatus maintenance is communicated between the pre-process factory and the post-process factory via the Internet or dedicated network.

Figure 23:
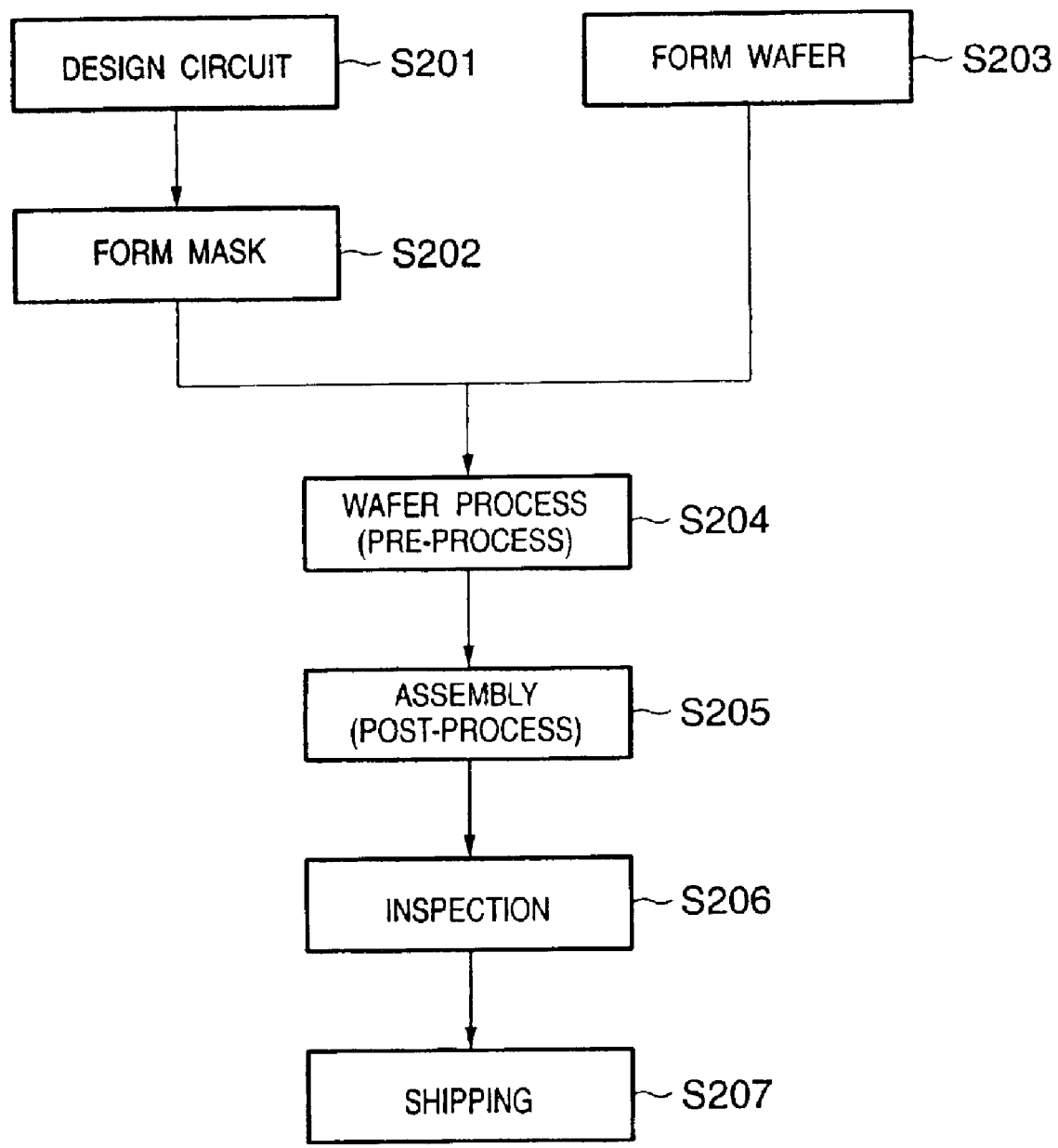
FIG. 23 is a flow chart showing the detailed flow of the wafer process in FIG. 22.

FIG. 23 shows the detailed flow of the wafer process. In step S211 (oxidation), the wafer surface is oxidized. In step S212 (CVD), an insulating film is formed on the wafer surface. In step S213 (electrode formation), an electrode is formed on the wafer by vapor deposition. In step S214 (ion implantation), ions are implanted in the wafer. In step S215 (resist processing), a photosensitive agent is applied to the wafer. In step S216 (exposure), the above-mentioned X-ray exposure apparatus exposes the wafer to the circuit pattern of a mask, and prints the circuit pattern on the wafer. In step S217 (developing), the exposed wafer is developed. In step S218 (etching), the resist is etched except for the developed resist image. In step S219 (resist removal), an unnecessary resist after etching is removed.

In step S220, it is determined whether or not the process ended. If the process has not ended yet, the process returns to step S211. On the other hand, the process has ended, the process is terminated.

These steps are repeated to form multiple circuit patterns on the wafer.

As has been described above, according to the present invention, proper light quantities can be set for respective position detection systems, and thus the mark detection precision can be increased. The present invention can achieve a short mark detection time and high alignment processing speed in addition to high mark detection precision.

As many apparently widely different embodiments of the present invention can be made without departing from the spirit and scope thereof, it is to be understood that the invention is not limited to the specific embodiments thereof except as defined in the claims.

What is claimed is:

1. An exposure apparatus comprising:
a plurality of detection systems which have photoelectric conversion elements and sense an alignment mark on an object to be exposed;
changing means for individually changing a charge storage time of the pixels of each of the photoelectric conversion elements based on a light amount of an image sensed by the photoelectric conversion elements;
calculation means for calculating the position of the alignment mark on the basis of electrical signals from the photoelectric conversion elements;
alignment means for aligning the object on the basis of the position of the alignment mark obtained by said calculation means; and
exposure means for performing exposure processing for the object aligned by said alignment means.

2. The apparatus according to claim 1, wherein said changing means comprises, for at least one of the plurality of photoelectric conversion elements:
a plurality of types of filters having different light quantity restriction amounts; and
selection means for selecting one of said plurality of types of filters, and causing light having passed through said selected filter to reach a corresponding photoelectric conversion element, and
wherein a light quantity stored in the corresponding photoelectric conversion element is adjusted by the combination of light quantity restriction amounts of the selected filter and a storage time of the corresponding photoelectric conversion element.

3. The apparatus according to claim 1, wherein said changing means changes an amplification factor of an output signal from each of the photoelectric conversion elements.

4. The apparatus according to claim 1, wherein said plurality of detection systems have different imaging magnifications.

5. The apparatus according to claim 4, wherein said plurality of detection systems have a common objective unit.

6. The apparatus according to claim 1, wherein
said changing means individually changes the storage time of at least one of the photoelectric conversion elements so as to make a light quantity that is stored in each of the photoelectric conversion elements fall within a predetermined range.

7. An exposure apparatus comprising:
a stage which can move while holding an object to be exposed;
a first detection system which has a first photoelectric conversion element and senses an alignment mark on the object at a first magnification;
a second detection system which has a second photoelectric conversion element and senses an alignment mark on the object at a second magnification higher than the first magnification;
changing means for individually changing a charge storage time of the pixels of at least one of the first and second photoelectric conversion elements based on a light amount of an image sensed by the photoelectric conversion elements;
first acquisition means for moving said stage, causing said first detection system to sense an alignment mark on the object, and acquiring a rough position of the alignment mark;
second acquisition means for moving said stage, causing the alignment mark to move to a field of view of said second detection system on the basis of the rough position, and acquiring the position of the alignment mark by sensing the alignment mark using said second detection system;
alignment means for aligning the object on the basis of a measurement result of an alignment mark acquired by said second acquisition means; and
exposure means for performing exposure processing for the object aligned by said alignment means.

8. The apparatus according to claim 7, further comprising:
determination means for determining a position and a rotation amount of the object with respect to said stage on the basis of, of the plurality of alignment marks, mark positions of a predetermined number of alignment marks obtained by said second acquisition means; and
third acquisition means for controlling movement of the object by said stage on the basis of the position and the rotation amount, causing said second detection system to sense remaining alignment marks, and acquiring positions of the alignment marks.

9. The apparatus according to claim 8, further comprising:
fourth acquisition means for controlling said stage on the basis of the acquired rough position, causing said second detection system to sense another alignment mark falling within a predetermined distance from the alignment mark whose rough position is acquired by said first acquisition means, and acquiring a position of said another alignment mark.

10. The apparatus according to claim 7, wherein said first and second detection systems have a common objective unit.

* * * * *

UNITED STATES PATENT AND TRADEMARK OFFICE
CERTIFICATE OF CORRECTION

PATENT NO.   : 6,930,016 B2
DATED        : August 16, 2005
INVENTOR(S)  : Kazuhiko Mishima et al.

It is certified that error appears in the above-identified patent and that said Letters Patent is hereby corrected as shown below:

Drawings,
Sheet 9 of 22, "FIG. 10," in the box labeled "S119," "shfitx" should read -- shiftx --.

Column 1,
Line 8, "and" should read -- and a --.

Column 2,
Line 8, "Kohler-illuminates" should read -- Köhler-illuminates --.
Line 64, "processing" should read -- processing, -- and "exposure" should read -- exposure, --.

Column 3,
Line 1, "control)" should read -- control) for --.
Lines 17, 29, 51 and 67, "comprising;" should read -- comprising: --.
Line 26, "invention" should read -- invention, --.
Lines 30 and 60, "with" should read -- while --.

Column 5,
Line 32, "16" should read -- sixteen --.
Line 37, "at" should read -- at a --.
Line 46, "Y2" should read -- Y2, --.
Line 52, "alignment," should read -- alignment, marks --.
Line 54, "at" should read -- at a --.

Column 6,
Line 10, "Also" should read -- Also, --.
Line 26, "and 3" should read -- and 3B --.

Column 7,
Lines 32 and 36, "system" should read -- system, --.
Line 46, "Ml" should read -- M1 --.

Column 8,
Line 4, "Also" should read -- Also, --.

Column 11,
Line 37, "by" should read -- for --.
Line 41, "step s119," should read -- step S119, --.

UNITED STATES PATENT AND TRADEMARK OFFICE
CERTIFICATE OF CORRECTION

PATENT NO. : 6,930,016 B2
DATED : August 16, 2005
INVENTOR(S) : Kazuhiko Mishima et al.

It is certified that error appears in the above-identified patent and that said Letters Patent is hereby corrected as shown below:

Column 14,
Line 60, "95%" should read -- 95% of --.

Column 15,
Line 53, "generate" should read -- generate an --.

Column 16,
Line 36, "of" should read -- of a --.
Line 37, "22" should read -- 23 --.
Line 45, "process)" should read -- process), --.
Line 47, "(assembly)" should read -- (assembly), --.
Line 48, "post-process" should read -- post-process, --.
Lines 50 and 53, "and" should read -- and a --.

Column 17,
Line 10, "process" should read -- process has --.
Line 12, "hand," should read -- hand, if --.

Signed and Sealed this

Seventh Day of February, 2006

JON W. DUDAS
*Director of the United States Patent and Trademark Office*